United States Patent
Itoh et al.

(10) Patent No.: US 6,545,525 B2
(45) Date of Patent: *Apr. 8, 2003

(54) SEMICONDUCTOR DEVICE INCLUDING INTERFACE CIRCUIT, LOGIC CIRCUIT, AND STATIC MEMORY ARRAY HAVING TRANSISTORS OF VARIOUS THRESHOLD VOLTAGES AND BEING SUPPLIED WITH VARIOUS SUPPLY VOLTAGES

(75) Inventors: Kiyoo Itoh, Higashi-kurume (JP); Hiroyuki Mizuno, Kokubunji (JP)

(73) Assignee: Hitachi, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/495,957

(22) Filed: Feb. 2, 2000

(65) Prior Publication Data

US 2003/0016075 A1 Jan. 23, 2003

Related U.S. Application Data

(63) Continuation of application No. 09/027,212, filed on Feb. 20, 1998, now Pat. No. 6,046,627.

(30) Foreign Application Priority Data

Feb. 28, 1997 (JP) .............................................. 9-045235

(51) Int. Cl.[7] .................................................. H03K 3/01
(52) U.S. Cl. .................. 327/524; 327/533; 365/185.24; 365/185.25
(58) Field of Search ................................. 327/543, 544, 327/545, 546, 534, 535, 547; 326/35, 36; 365/185.24, 185.25

(56) References Cited

U.S. PATENT DOCUMENTS

| | | | |
|---|---|---|---|
| 4,837,460 A | | 6/1989 | Uchida ........................ 327/382 |
| 5,148,393 A | | 9/1992 | Furuyama ................... 365/149 |
| 5,394,365 A | | 2/1995 | Tsukikawa .............. 365/189.09 |
| 5,422,591 A | | 6/1995 | Rasgtegar et al. ........... 327/409 |
| 5,448,198 A | | 9/1995 | Toyoshima et al. ......... 327/530 |
| 5,583,457 A | * | 12/1996 | Horiguchi et al. .......... 327/544 |
| 5,656,970 A | * | 8/1997 | Campbell et al. ........... 327/534 |
| 5,748,029 A | | 5/1998 | Tomashini et al. .......... 327/389 |
| 5,751,651 A | * | 5/1998 | Ooishi ......................... 365/226 |
| 5,801,576 A | * | 9/1998 | Ooishi ......................... 327/530 |
| 5,874,851 A | * | 2/1999 | Shiota ......................... 327/534 |
| 5,880,623 A | * | 3/1999 | Levinson .................... 327/530 |
| 6,031,778 A | * | 2/2000 | Makino et al. ............. 327/534 |
| 6,046,627 A | * | 4/2000 | Itoh et al. ................... 327/546 |
| 6,097,113 A | * | 8/2000 | Teraoka et al. ............. 327/534 |

OTHER PUBLICATIONS

T. Kuroda et al, "Low–Power & Communication Signal Processing", IEEE International Solid State Circuit, Digest of Technical Papers, 1996, pp. 166–167.

S. Itoh, "Cho–eluesuai", Baifukan, Nov. 5, 1994, pp. 239–328.

* cited by examiner

Primary Examiner—Timothy P. Callahan
Assistant Examiner—An T. Luu
(74) Attorney, Agent, or Firm—Mattingly, Stanger & Malur, P. C.

(57) ABSTRACT

The well voltage of a CMOS circuit having low-threshold-voltage MOSFETs is controlled when the power supply is turned on, during normal operation, and when the supply voltage is cut off. The CMOS circuit can thus operate stably with lower power consumption, because latching-up is reduced when the supply voltage is applied to the CMOS circuit or when the supply voltage is cut off, and subthreshold current is decreased during normal operation.

9 Claims, 23 Drawing Sheets

SEMICONDUCTOR DEVICE INCLUDING INTERFACE CIRCUIT, LOGIC CIRCUIT, AND STATIC MEMORY ARRAY HAVING TRANSISTORS OF VARIOUS THRESHOLD VOLTAGES AND BEING SUPPLIED WITH VARIOUS SUPPLY VOLTAGES

This is a continuation application of U.S. Ser. No. 09/027,212, filed Feb. 20, 1998 now U.S. Pat. No. 6,046,627.

BACKGROUND OF THE INVENTION

1. Field of the Invention

The present invention relates generally to semiconductor devices, and, more particularly, to semiconductor devices that combine high-speed performance and low power consumption.

2. Description of the Related Art

An example of reducing power consumption by substrate bias control is described in 1996 *IEEE International Solid-State Circuit, Digest of Technical Papers*, (1996), pp. 166–167.

With the recent popularity of low-power CMOS LSIs (Complementary Metal Oxide Semiconductor Large Scale Integrated circuits), a trend has developed to maintain high-speed operation by decreasing the threshold voltage $V_T$ of the MOSFETs as the operating or supply voltage is dropped. When the supply voltage drops to 2 V or lower and when the threshold voltage $V_T$ is decreased to 0.5 V or lower correspondingly, however, the subthreshold leakage current increases, whereby the transistor cannot be cut off completely. Consequently, the standby current of the LSI chip increases, which represents a bottleneck in the design of a system that includes a battery-powered CMOS LSI chip. Furthermore, the current during normal operation also increases as the threshold voltage $V_T$ increases.

In order to break the bottleneck, a well-known system achieves a high-speed operation by decreasing the threshold voltage of each of the MOSFETs in the chip during normal operation, and decreases the standby current by increasing the threshold voltage at the time of standby. Nevertheless, the following three problems exist in this system:

(1) An overcurrent flows because of latching-up when the power supply is turned on, and the wiring in the CMOS LSI chip may fuse, or the normal supply voltage may become inapplicable as the load exceeds the current capacitance of the power supply. This problem is caused because the layout and connections of the circuit are designed so that the substrate (well) and source of the MOSFET are not at equipotential.

For example, when a p-channel MOSFET (PMOSFET) is used for applying a positive supply voltage (e.g., 1.8 V) to the source (p-layer), the pn junction between the source and well is excessively biased in the forward direction because the well (n-well) remains at a floating 0 V just until the application of the supply voltage, thus causing latch-up of the CMOS. In the case of conventional CMOS LSI products at 2 V or higher, the pn junction is never biased in the forward direction as in the normal operation thereafter, even during the application of the supply voltage, since the well and source of the MOSFET are connected so that both are at equipotential as much as possible. Since the threshold voltage $V_T$ is constant at all times at a value of substantially 0.5 or higher, moreover, there is no problem of subthreshold current.

In the case of an n-channel MOSFET (NMOSFET), the problem is not so serious. When the supply voltage is applied to the drain, the substrate (p-well) of the NMOSFET is at a floating 0 V and the source is fixed to an earth potential of 0 V, because the pn junction, formed between the drain and the well, is not biased in the forward direction. However, there is a subthreshold current flowing between the drain and source when the threshold voltage is 0.5 V or lower. By separately controlling the well and source, the threshold voltage in the CMOS LSI is lowered.

(2) The time required to switch the normal mode to the standby mode and the time required to switch the standby mode to the normal mode are extremely long, on the order of $\mu$s. Assuming that the substrate voltage is generated on-chip, by a charge pumping circuit for pumping the capacitor in the chip, the output current is limited to a low level. On the other hand, the transistor in the chip is used to connect the power supply terminals of the substrate in common, and consequently the total substrate capacitance has an extremely large value (100 pF or greater). Therefore, a large load (substrate) capacitance is driven by a substrate-voltage generating circuit whose current driving capability is low when the mode is switched, so that the response time tends to become longer.

(3) The subthreshold current flows everywhere, even in the CMOS circuit, thus increasing the operating current of the whole chip. This problem exists because, in the inactive state, the threshold voltage of the transistor in the CMOS circuit or circuit block is low during normal operation.

SUMMARY OF THE INVENTION

The present invention controls the substrate or well voltage of a transistor in a manner that solves the foregoing three problems.

An object of the invention is to hinder the latching-up that occurs when the supply voltage is applied to a CMOS circuit that includes MOSFETs having a low threshold voltage, or when the supply voltage is cut off to the CMOS circuit.

Another object of the invention is to decrease the sub-threshold current during normal operation.

A further object of the invention is to realize low power consumption while maintaining high operating speed, for a CMOS circuit that operates at a voltage of 2 V or below, a CMOS LSI, and a semiconductor device using the CMOS circuit.

In general, the invention achieves these and other objects by controlling the well voltage of a CMOS circuit when the power supply is turned on and when cut off, and during operation.

In one embodiment of the invention, in which the CMOS circuit includes MOSFETs that cannot be cut off substantially satisfactorily during normal operation, after the well voltage is applied to the well of the CMOS circuit so that the MOSFETs can be cut off, the supply voltage is applied to the CMOS circuit.

In another embodiment, after a third supply voltage (generated from a first supply voltage by a voltage conversion circuit) is applied as a well voltage to the well of the CMOS circuit, a second supply voltage is applied to the CMOS circuit.

In yet another embodiment, the invention provides a circuit for fixing the well potential of the CMOS circuit, and a circuit for varying the well potential of the MOSFETs by capacitive coupling according to the variation of the input signal of the CMOS circuit.

In still another embodiment, the invention provides a semiconductor device that includes a dynamic memory cell comprising a MOSFET, a capacitor, and a CMOS circuit, wherein the well potential of the MOSFETs constituting the CMOS circuit is subjected to a pulse variation, and wherein the substrate voltage of the dynamic memory cell is substantially a DC supply voltage.

In another embodiment, the invention provides a semiconductor device including a static memory cell that is operated at a high voltage and is constituted by MOSFETs of high threshold voltage, and a CMOS circuit operated at a low voltage and constituted by MOSFETs having a low threshold voltage. The well potential of the MOSFETs constituting the CMOS circuit is subjected to a pulse variation.

In yet another embodiment, the invention provides a semiconductor device including at least one CMOS circuit, a standby control circuit, and a voltage conversion circuit, wherein the voltage generated by the voltage conversion circuit is supplied to the standby control circuit, and the standby control circuit varies the well potential of the CMOS circuit using the output of the voltage conversion circuit, depending on operating conditions. A capacitor having a capacitance that is greater than the capacitance of the well is connected to the output of the voltage conversion circuit.

DETAILED DESCRIPTION OF THE PREFERRED EMBODIMENTS

Figure 1:
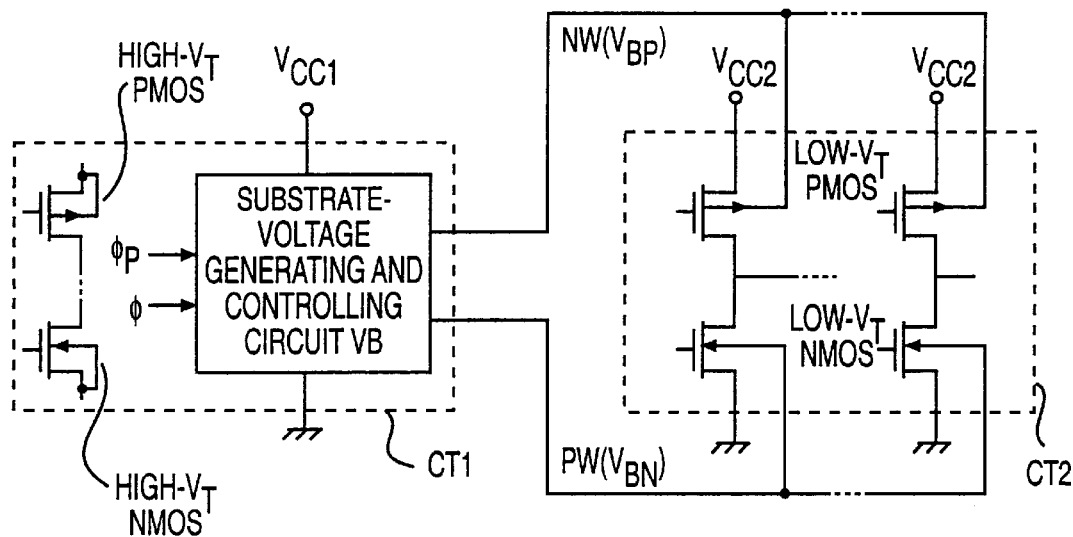
FIG. 1 illustrates a CMOS semiconductor device constructed according to the teachings of the present invention.

In the preferred embodiment illustrated in FIG. 1, a circuit block CT1 operating with a high supply voltage $V_{CC1}$ (e.g., 3.3 V) employs MOSFETs each having a selectable threshold voltage $V_T$ as high as 0.5 V, for example, during operation. Since the supply (operating) voltage is sufficiently high, high-speed operation is possible without dropping the threshold voltage to 0.1 V or thereabouts. Therefore, any subthreshold current that exists is sufficiently small to be ignored, without especially switching the threshold voltage during normal operation to the standby voltage, whereby the source of the transistor and its substrate can be connected at a common voltage.

FIG. 1 also shows a substrate voltage generating and control circuit VB, which is operated with control signals $\phi_P$, $\phi$.

A circuit block CT2 operating with a low supply voltage $V_{CC2}$ (e.g., 1.8 V), on the other hand, has internal transistors that are operated at high speed by dropping their threshold voltage to, for example, 0.1 V during normal operation. At standby, the threshold voltage must be increased to, for example, 0.5 V so as to reduce the standby current. The control of the threshold voltage is effected by controlling the substrates NW, PW of the transistors.

Figure 2:
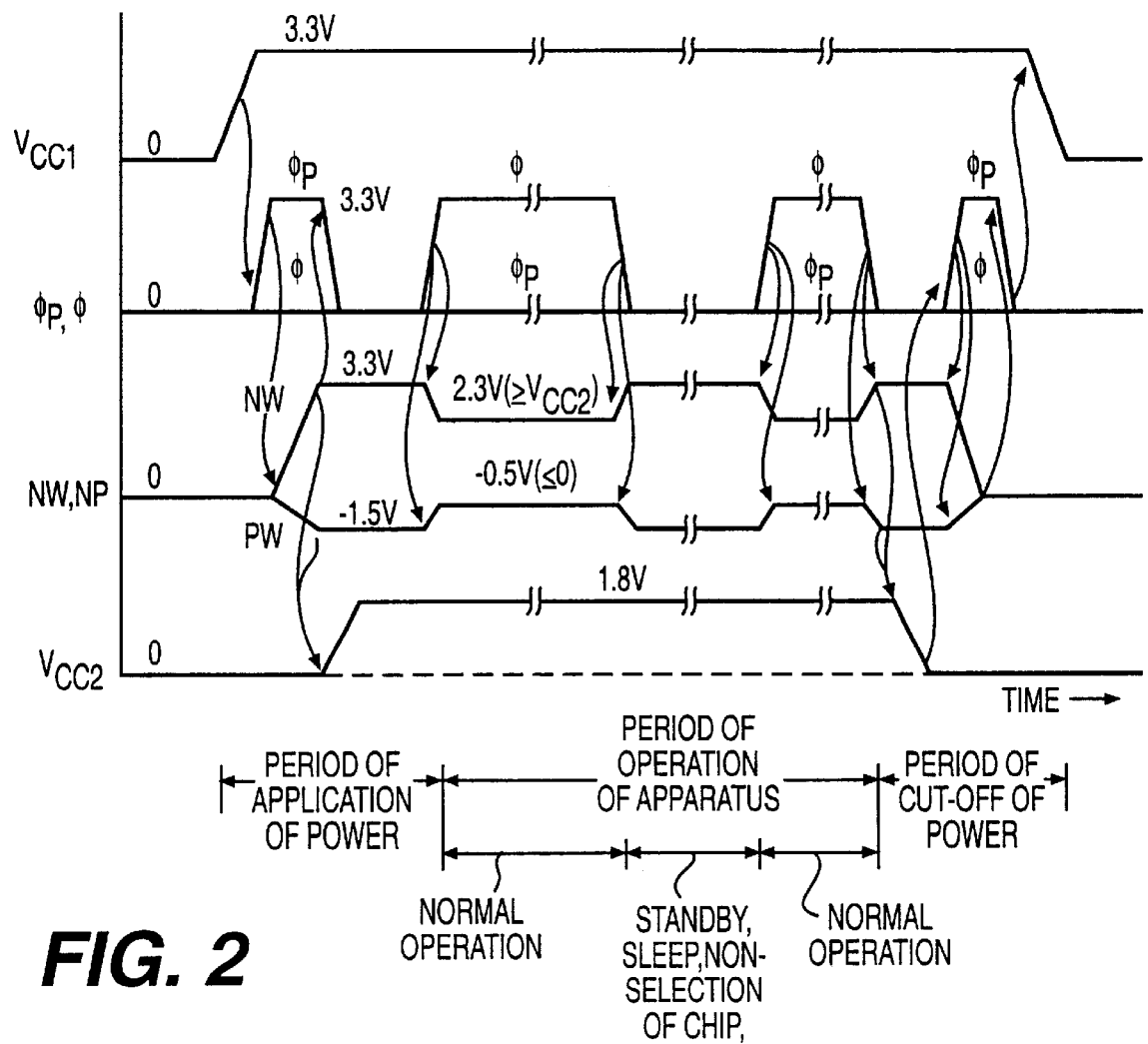
FIG. 2 is a chart of timing diagrams for the CMOS semiconductor device shown in FIG. 1.

The substrate voltage of the transistors in the circuit block CT2 is controlled as shown in FIG. 2.

The voltages $V_{BP}$, $V_{BN}$ of the substrates NW, PW are produced on the basis of the 3.3 V initially applied as $V_{CC1}$, and the voltages are selected to have a value sufficient for the transistors in the circuit block CT2 to be cut off during the low-voltage operation. For example, VBP can be set at 3.3 V, and $V_{BN}$ at −1.5 V.

First, the substrate voltage is applied to the circuit block CT2, and then the low supply voltage $V_{CC2}$ is applied thereto. Consequently, since the threshold voltage of the transistors in the circuit block CT2 becomes sufficiently high in the course of applying the low supply voltage, no excessive chip current appears because the subthreshold current from each transistor is accumulated, and no latching-up occurs because the supply voltage of each transistor never comes into a floating state of about 0 V.

Then, the operation is changed to the normal operation by decreasing the voltages $V_{BP}$, $V_{BN}$ of the substrates NW, PW (to, for example, 2.3 V and −0.5 V or thereabout) in order to lower the threshold voltage of the transistors in the circuit block CT2. The threshold voltage is increased by boosting the substrate voltages $V_{BP}$, $V_{BN}$ (to e.g., 3.3 V and −1.5 V) at standby, when a clock in the circuit block is stopped (fixed to a high or low level), at the time of sleeping, or at the time of non-selection of the chip, whereby an increase in power consumption due to the subthreshold current is reducible.

When the power supply is cut off, the substrate voltages $V_{BP}$, $V_{BN}$ are sufficiently boosted, and then the supply voltage $V_{CC2}$ is turned off. Further, the supply voltage $V_{CC1}$ is also turned off. Thus, the order of application of the supply voltages is as follows: a timer sets a time interval following the application of the high supply voltage $V_{CC1}$, and then the low supply voltage $V_{CC2}$ is input.

The circuit blocks CT1 and CT2 may be constituted by different semiconductor chips, or they may be integrated onto a single chip.

Figure 3:
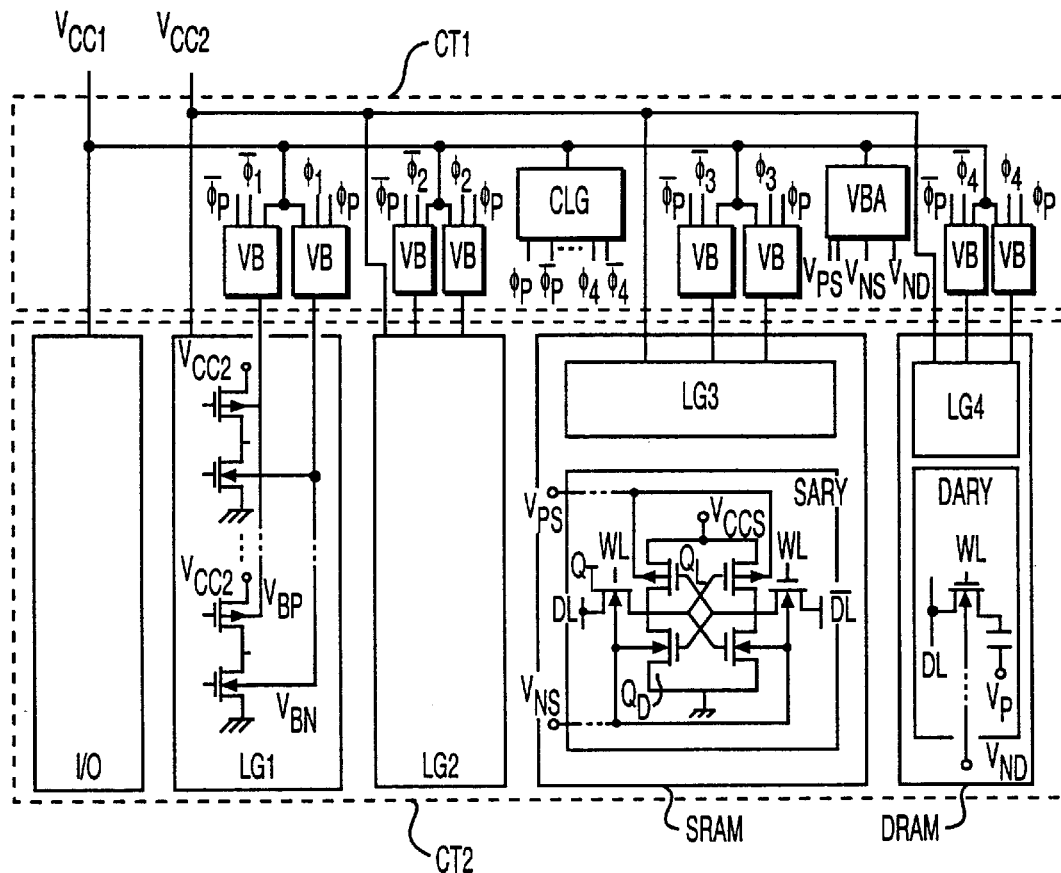
FIG. 3 illustrates a CMOS LSI chip constructed according to the teachings of the present invention.

FIG. 3 shows an embodiment of the present invention in which the circuit block CT1 and the circuit block CT2 are integrated onto one chip. In FIG. 3, an interface circuit I/O interfaces with the exterior of the chip; circuit blocks LG1–LG4 control the substrate voltage and are constituted by circuits that include transistors of low threshold voltage; a static memory SRAM includes a memory array SARY constituted of static memory cells; a power supply voltage $V_{CCS}$ supplies power to the memory cells; and a dynamic memory DRAM includes a memory array constituted by dynamic memory cells, each having MOSFETs and a capacitor, on one electrode of which is a capacitor electrode voltage $V_P$. In the static and dynamic memory cells, DL, /DL represent data lines, and WL represents a word line. The memory arrays SARY and DARY may be constituted by transistors having a high threshold voltage, although such are not required.

VB denotes a substrate-voltage generating circuit, which is controlled by a group of signals ($\phi_P$, /$\phi_P$, $\phi_1$, /$\phi_1$, $\phi_2$, /$\phi_2$, $\phi_3$, /$\phi_3$, $\phi_4$), /$\phi_4$) from a substrate-voltage control circuit CLG; and VBA denotes a substrate-voltage generating circuit for supplying substrate voltages $V_{PS}$, $V_{NS}$, $V_{ND}$ in the memory array SARY and in the memory array DARY. Each of the substrate voltages $V_{PS}$, $V_{NS}$, $V_{ND}$ is normally a DC voltage or a semi-DC voltage (that is, a DC voltage with an AC ripple).

The principal portion of the circuit block CT1 including the substrate-voltage generating circuit VB, the substrate-voltage control circuit CLG, and the substrate-voltage generating circuit VBA, is constituted by MOSFETs of high threshold voltage. Moreover, a high supply voltage $V_{CC1}$ is supplied to the interface circuit I/O and the substrate-voltage generating circuit VB, whereas a low supply voltage $V_{CC2}$ is supplied to the other circuit blocks.

The memory arrays SARY and DARY receive their substrate voltages in a different manner, because of the high density of the memory cells that make up the arrays (a high-density array is generally preferable because its area accounts for a large percentage of the area of the whole chip). For the high density of cells, the element isolation width needs narrowing. However, because the substrate bias system oridnarily gives a substrate voltage which is constant, with a substantially DC current, to the whole of the memory array simultaneously, the power consumption of the whole chip increases due to the large substrate capacitance. Thus, the element isolation characteristics are deteriorated when the substrate capacitance of this portion is driven. Therefore, the substrate voltages $V_{NS}$, $V_{PS}$ in the memory array SARY are set at 0 V, respectively, and a voltage equal to the supply voltage $V_{CCS}$, and the substrate voltage $V_{ND}$ in the memory array DARY is substantially a DC voltage of about −1.5 V.

The memory cells in the memory array SARY are flip-flops. If the threshold voltage of a transistor forming one of the flip-flops is too low, the subthreshold current in the memory cell increases. Since the memory array SARY is constituted by a number of cells, the current required for the memory array SARY as a whole amounts to a large value. Consequently, the cells are caused to operate at high speed by setting not only the threshold voltage of the transistor in each cell to be as high as about 0.5 V, but also to set a high supply voltage $V_{CCS}$ corresponding to the high threshold voltage. For example, the supply voltage $V_{CCS}$ can be effectively set to the supply voltage $V_{CC1}$ (3.3 V), which is higher than the supply voltage $V_{CC2}$ (1.8 V) because the number of power supplies is not increased.

Figure 4:
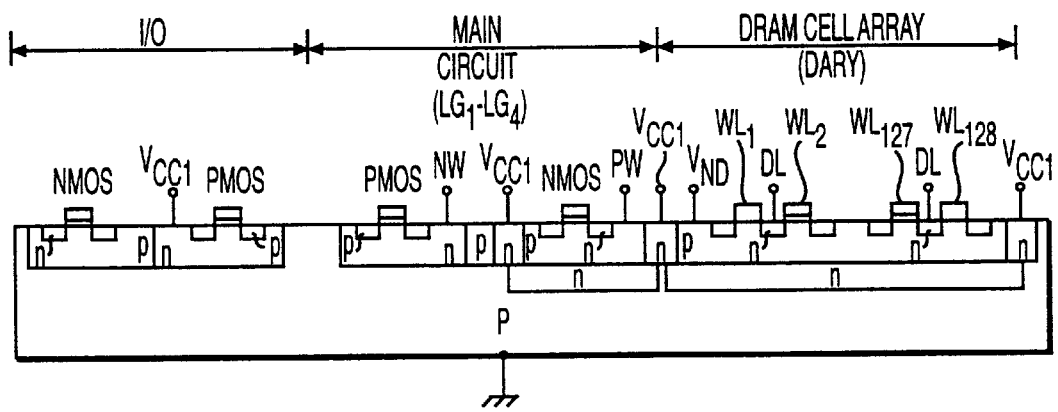
FIG. 4 illustrates a section of the CMOS LSI chip of FIG. 3.

FIG. 4 is a schematic diagram of a sectional structure of the representative device of FIG. 3. In FIG. 4, capacitors in the memory array portion of the static memory SRAM and the memory array portion of the dynamic memory DRAM are omitted to make the drawing easy to understand.

Next, a description will be given of the application of the invention to each interior circuit block shown in FIG. 3.

Figure 5:
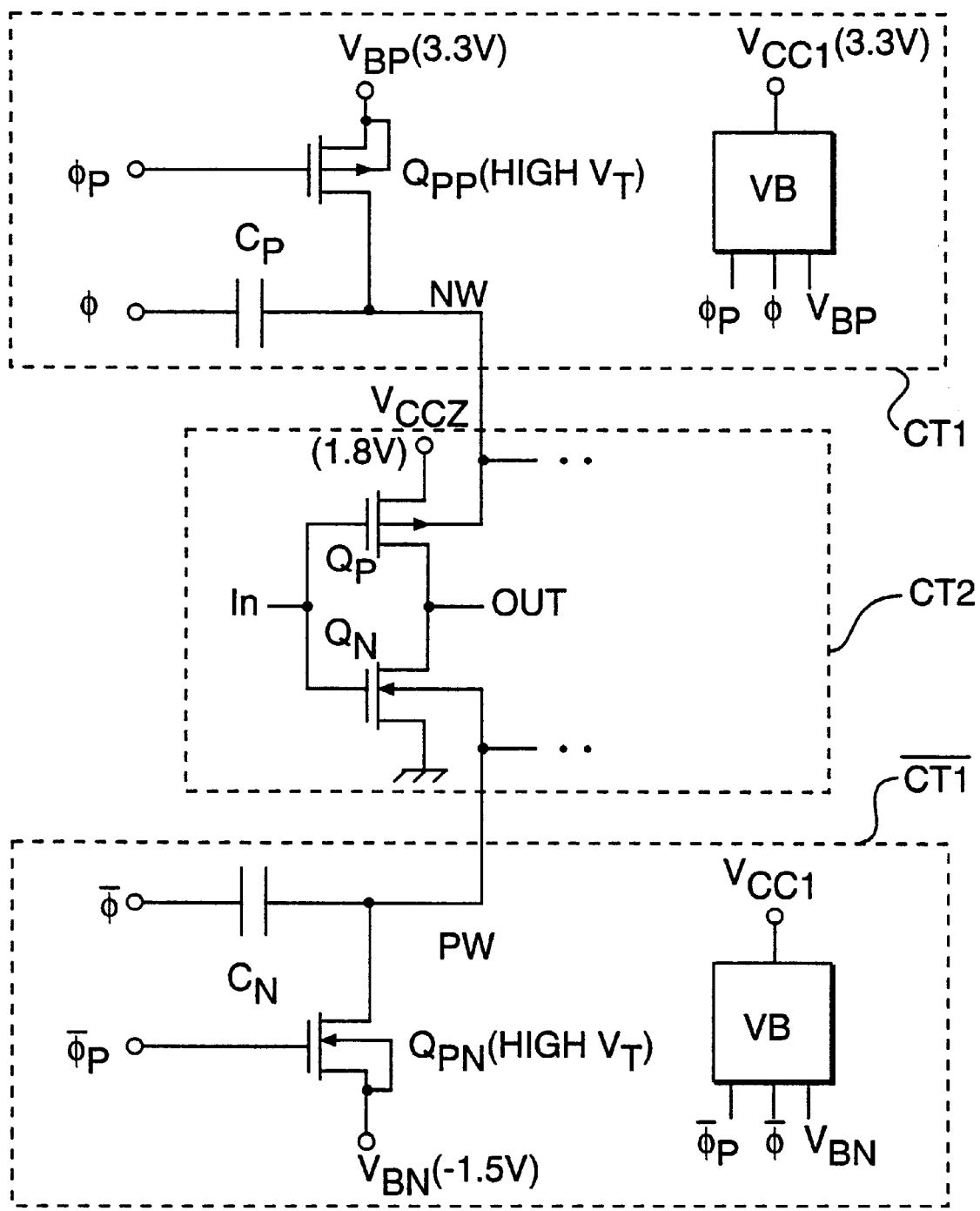
FIG. 5 illustrates a CMOS circuit constructed according to the teachings of the present invention.

FIG. 5 illustrates an embodiment of the present invention applied to a sub-circuit block LG (e.g. any of LG1–LG4) of FIG. 3. The substrate voltages (of substrates NW, PW) of the low-threshold voltage MOSFETs in the circuit block CT2 are controlled by the circuit block CT1 and a circuit block/CT1. According to this embodiment, capacitors $C_P$ and $C_N$ are employed in the control. The substrate-voltage generating/controlling circuit VB generates and outputs control signals ($\phi_P$, $\phi$, /$\phi_P$, /$\phi$) and the substrate bias voltages ($V_{BP}$, $V_{BN}$) from the high supply voltage $V_{CC1}$ (e.g., 3.3 V). A p-channel transistor (PMOSFET) $Q_{PP}$ and an n-channel transistor (NMOSFET) $Q_{PN}$ have high threshold voltages.

Figure 6:
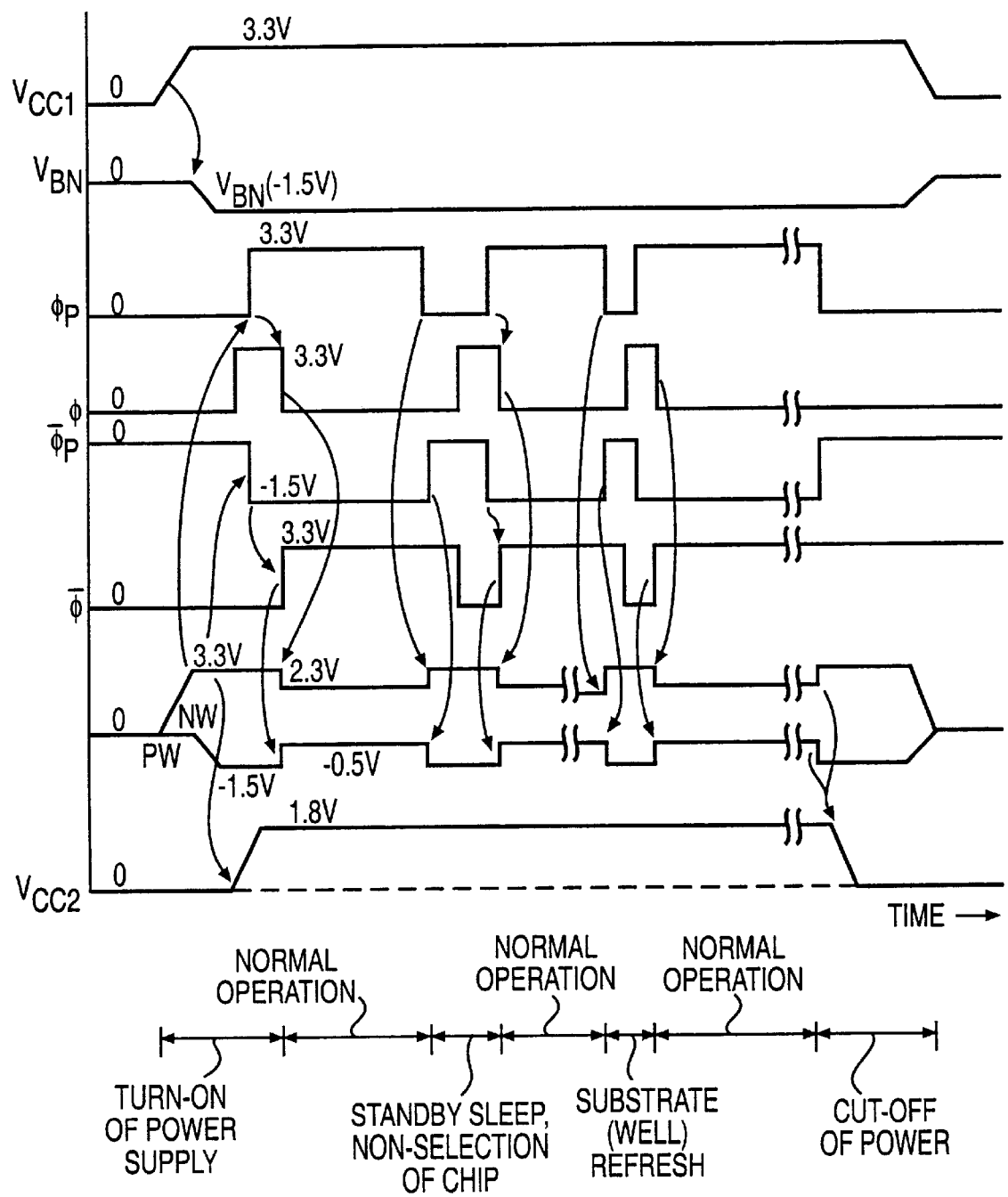
FIG. 6 is a chart of timing diagrams for the CMOS circuit shown in FIG. 5.

The timing diagrams of FIG. 6 explain the operation of the circuit shown in FIG. 5. The substrate bias voltages $V_{BP}$, $V_{BN}$ are generally produced by the substrate-voltage generating/controlling circuit VB on the basis of the 3.3 V initially applied, and thus a description will be given of an example of substituting $V_{CC1}$ (3.3 V) directly for the substrate bias voltage $V_{BP}$.

First, the substrate bias voltage $V_{BP}$ is applied to the circuit block CT2, and then the low supply voltage $V_{CC2}$ is applied to the circuit block CT2. Therefore, the threshold voltage of each transistor in the circuit block CT2 is sufficiently high, as high as 0.5 V for example, in the course of applying the low supply voltage $V_{CC2}$. Thus, the pn junction is not biased in the forward direction. Consequently, the subthreshold current from the respective transistors does not accumulate and become an overcurrent, and no latching-up occurs.

When the circuit enters normal operation, the control signals $\phi_P$ and $/\phi_P$ are respectively set at a high voltage level H and a low voltage level L, so as to turn off the transistors $Q_{PP}$, $Q_{PN}$; then, the control signals $\phi_P$ and $/\phi_P$ are respectively set at L and H. Thus, the capacitor coupling ($C_P$, $C_N$) causes the substrate voltages on the substrates NW, PW to change to, for example, about 2.3 V and –0.5 V, respectively. Since the voltage of the substrate decreases, the threshold voltage of each transistor in the circuit block CT2 also decreases and high-speed operation is made possible.

In order to change the operation from this state to standby, sleeping, or non-selection of the chip, the control signals $\phi_P$ and $/\phi_P$ are respectively set at L and H to turn on the transistors $Q_{PP}$, $Q_{PN}$; then, the control signals $\phi_P$ and $/\phi_P$ are respectively returned to H and L. Since a deep voltage is applied to the substrate, the threshold voltage of each transistor in the circuit block CT2 becomes as high as 0.5 V. Consequently, the power consumption can be prevented from increasing because of the subthreshold current.

Varying the substrate voltage according to the operating mode is advantageous in that it can be performed instantly by capacitive coupling through the capacitors $C_P$, $C_N$. However, the substrate voltage gradually decreases due to the pn junction leakage current of the source and drain, or the substrate current of the MOSFET. Particularly, the substrate current becomes large in proportion to the operating frequency.

The substrate (well) refresh shown in FIG. 6 is the operation of resetting the potential to 2.3 V and –0.5 V. The refresh operation is performed by, though not limited to, monitoring the substrate voltage. Alternatively, the time of refresh can be determined by a timer. The refresh operation is constituted by placing the circuit from the normal operating state into the standby state, and then returning the circuit to the normal operating state again. Varying the refresh interval according to the magnitude of the substrate current (for example, making the refresh interval shorter when the chip is to perform a high-speed operation than when it is to perform a low-speed operation) is effective in improving the reliability of the operation.

Figure 7:
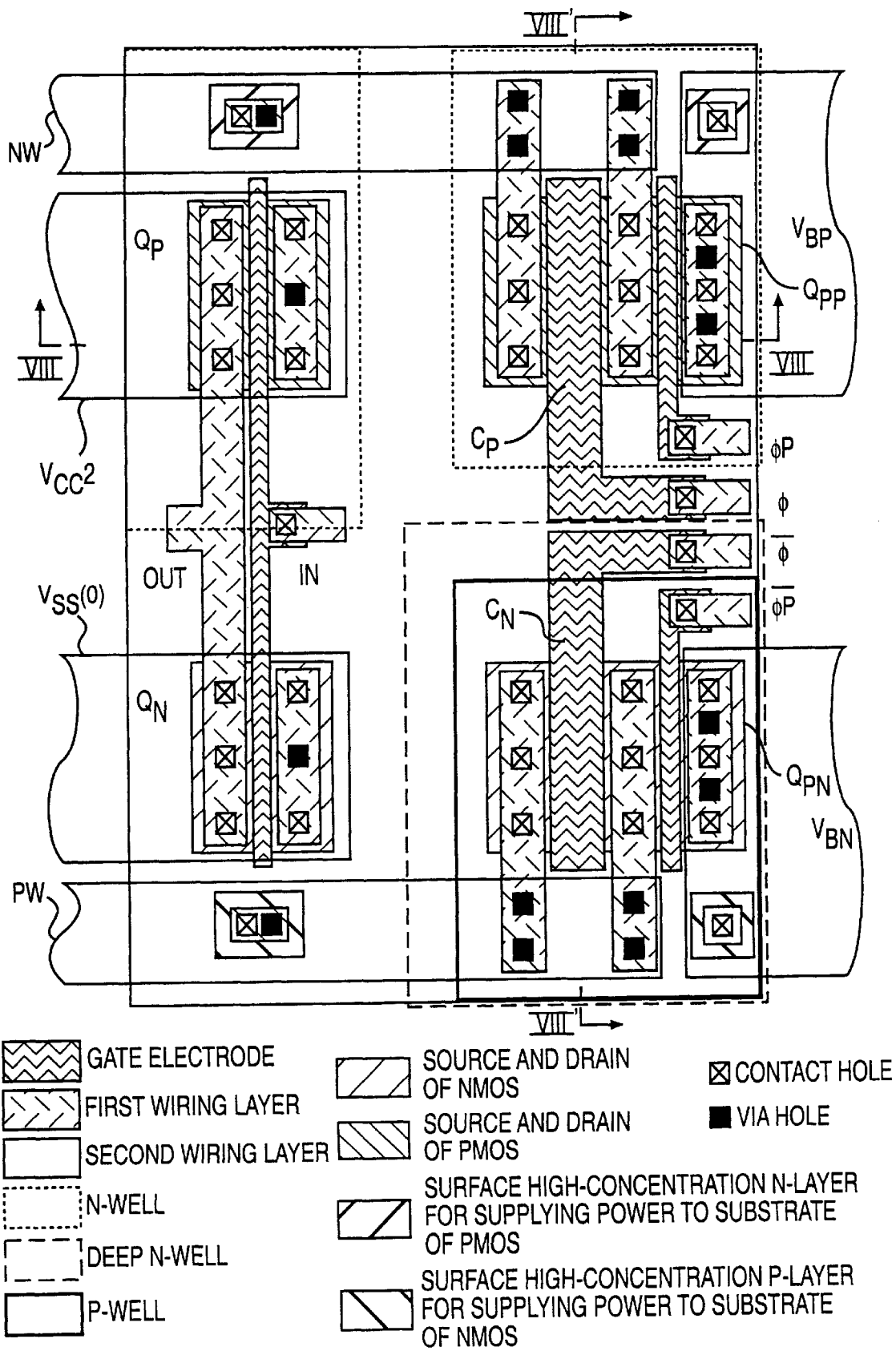
FIG. 7 illustrates a layout for the circuit of FIG. 5.
Figure 8A:
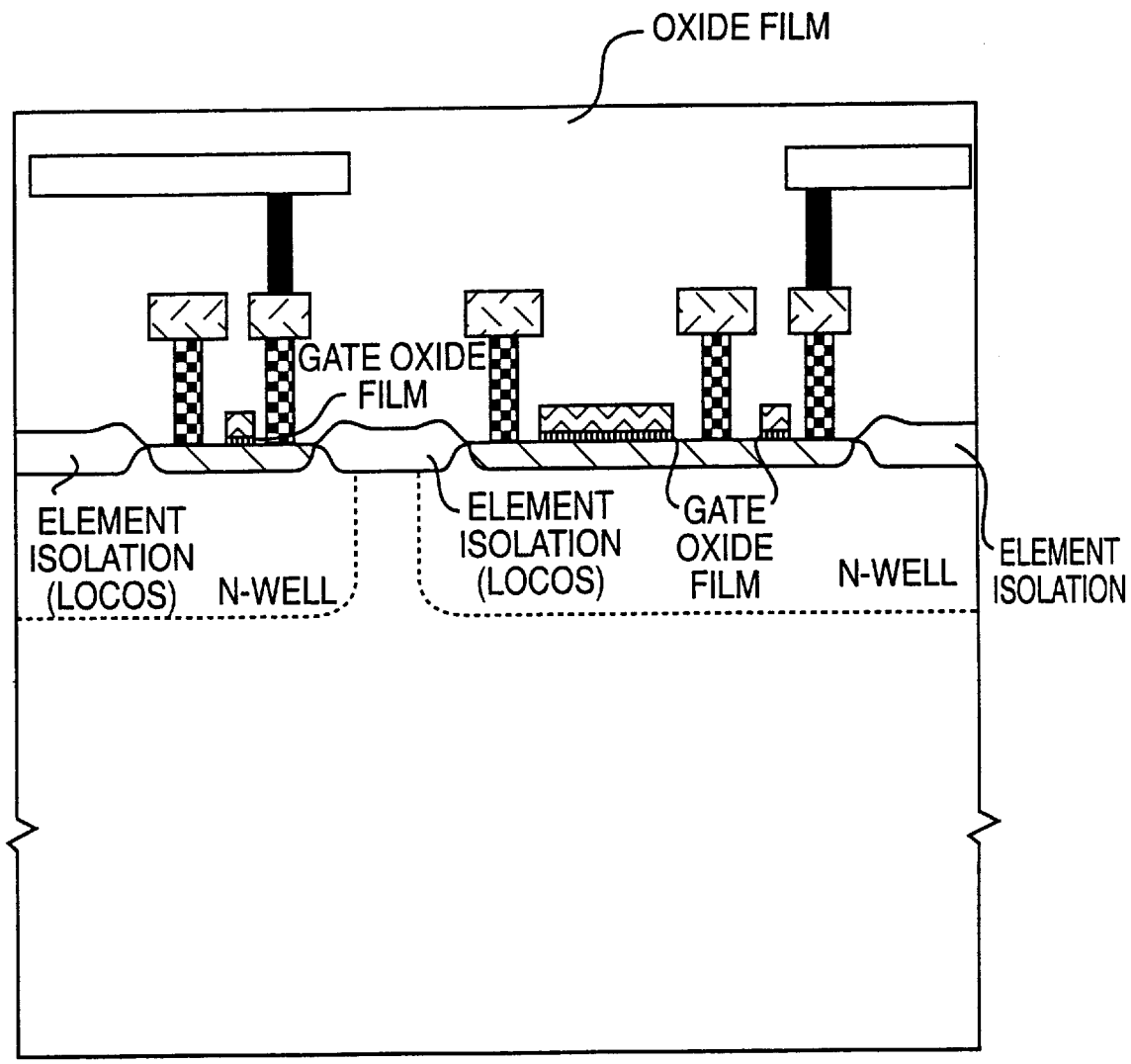
FIG. 8(a) illustrates a sectional view taken along line VIII—VIII of the layout shown in FIG. 7.
Figure 8A:
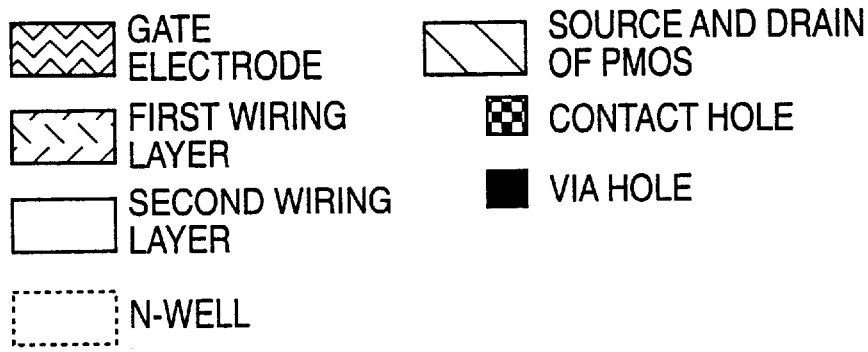
Figure 8B:
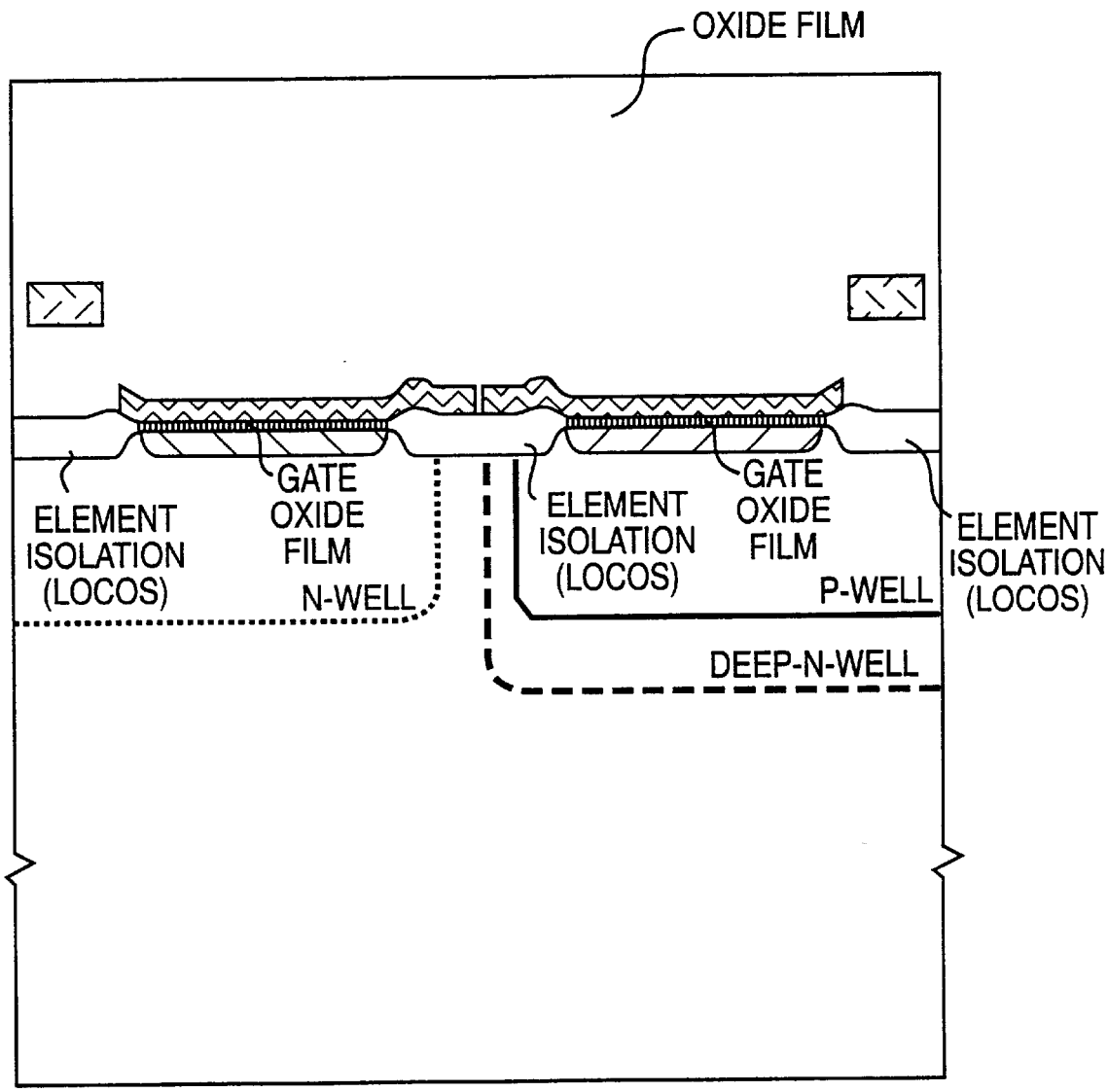
FIG. 8(b) illustrates a sectional view of another layout of the circuit of FIG. 5, taken along line VIII'—VIII'.

FIG. 7 shows an example of a layout of the transistors $Q_{PP}$, $Q_{PN}$ and the capacitors $C_P$, $C_N$ of FIG. 5. FIG. 8(a) is a sectional view taken along the lines VIII—VIII of the layout of FIG. 7. FIG. 8(b) is a sectional view taken along the lines VIII'—VIII' of the layout of FIG. 7. The substrate bias voltages $V_{BP}$, $V_{BN}$ are connected to the sources of the transistors $Q_{PP}$, $Q_{PN}$ via a second wiring layer (second metal wiring layer). The drains of transistors $Q_{PP}$, $Q_{PN}$ are connected to the second wiring layer and output the substrate voltages to the substrates NW, PW of the main circuit. Moreover, the capacitors $C_P$, $C_N$ are MOS capacitances.

Figure 9:
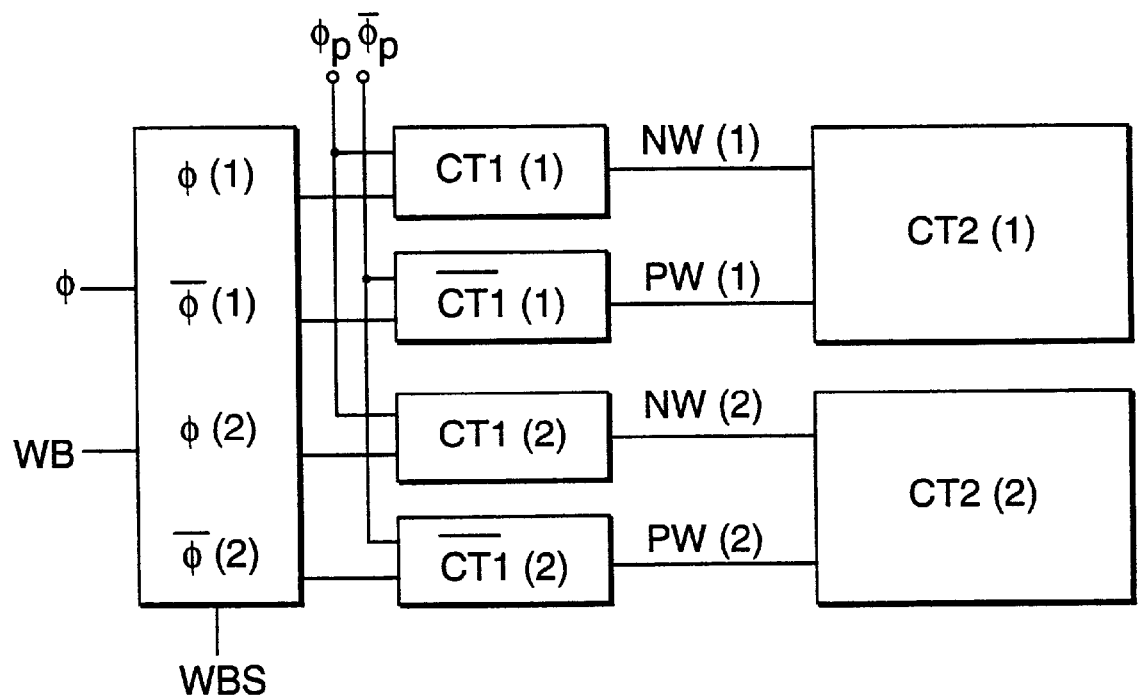
FIG. 9 illustrates the selection and driving of a circuit subblock according to the present invention.

FIG. 9 shows an application of FIG. 5, in which one of two sub-circuit blocks CT2(1), CT2(2) is selectively driven. In a selected sub-circuit, for example, only the substrate-voltage generating circuits CT1(1), /CT1(1) associated with the sub-circuit block CT2(1) are selectively driven by a well block selection signal WB and a start clock $\phi$, and the voltages of the wells NW(1), PW(1) which belong thereto are driven so that the threshold voltages of the MOSFETs in CT2(1) are dropped. Since the wells of the non-selected sub-circuit block CT2(2) are not driven, on the other hand, the threshold voltage of the MOSFETs in the sub-circuit block CT2(2) remains high.

If the division-selection driving is not effected as described above, the entire well of the sub-circuit block CT2(1) and the sub-circuit block CT2(2) needs driving, and the subthreshold current made to flow by the low threshold voltage during the normal operation is caused to flow from all of the MOSFETs in the sub-circuit block CT2(1) and the sub-circuit block CT2(2). Therefore, in this embodiment of the invention, the power and the subthreshold current accompanying the pulse driving are also halved.

Figure 10A:
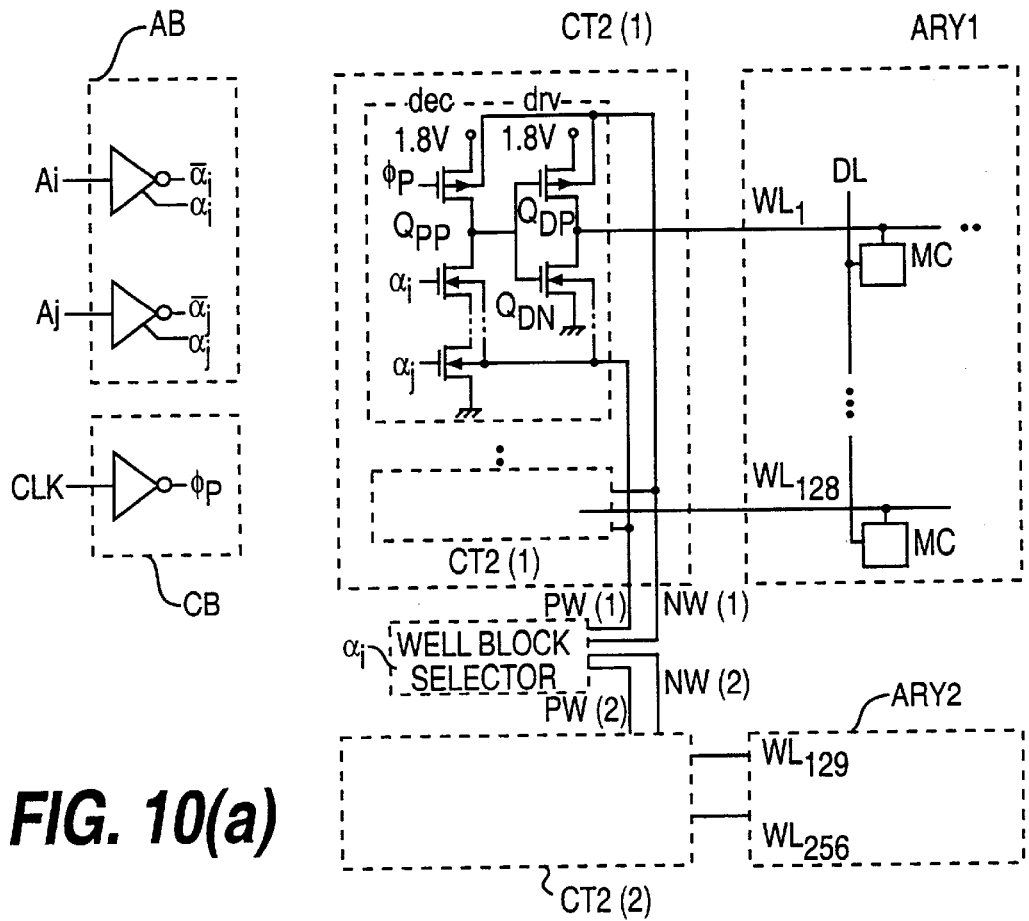
FIG. 10(a) illustrates a line selection circuit.
Figure 10B:
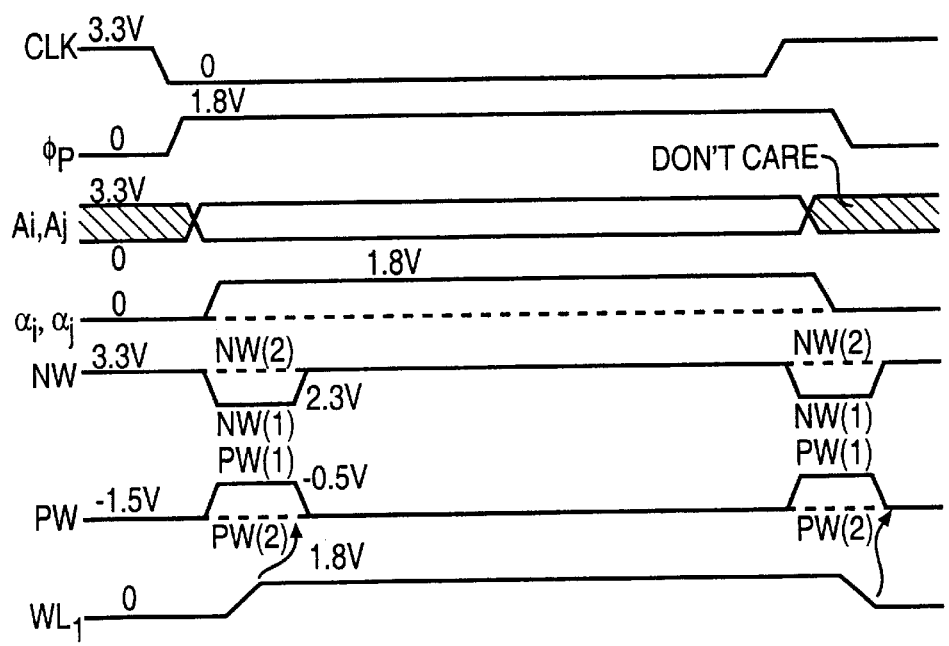
FIG. 10(b) illustrates a timing chart for the operation of the circuit of FIG. 10(a)

FIG. 10 shows an example in which the circuit of FIG. 9 is applied to the line decoders of the memory arrays SARY and DARY and drivers. The memory arrays are normally divided into a number of sub-arrays, and the line decoders as well as the word-line driving circuits (word drivers) are disposed so as to correspond to respective sub-arrays. Since only a few sub-arrays are actually selected and driven, the line decoders belonging to the selected sub-arrays and the well of the MOSFETs in the word driver are driven so that the threshold voltage is decreased, and most of the line decoders and the wells of the non-selected sub-arrays are not driven (so as to maintain a high threshold voltage), whereby the power consumption and the subthreshold current as a whole are sharply decreased.

In FIG. 10, two exemplary sub-arrays ARY1, ARY2 are shown conceptually. The sub-arrays ARY1, ARY2 have 128 word lines WL and a plurality of data lines DL (only one is shown for simplicity). A memory cell MC is connected at the intersection of a word line and a data line. To each word line WL, a word driver drv and a line decoder dec are connected. The word driver drv comprises a CMOS inverter $Q_{DP}$, $Q_{DN}$. The line decoder dec is a NAND logic circuit with the NMOSFETs connected in series, and each gate is supplied with internal address signals ai, . . . , aj and the like.

While an external clock is asserted (3.3 V), the line decoder is precharged. When the clock CLK is changed to L (0 V), the PMOSFET $Q_{PP}$ is turned off and the internal address signal is changed from 0 V to 1.8 V or 0 V, depending on the logical condition of the external address Ai, . . . , Aj. In the case of an address signal for selecting the word line $WL_1$, for example, all of the NMOSFETs of the decoder dec connected to the word line $WL_1$ and the input of the word driver drv are discharged to 0 V, so that the PMOSFET QDP is turned on. Consequently, a pulse voltage of 1.8 V is applied to the word line $WL_1$. When the wells NW(1), PW(1) in the circuit block CT2(1) including the selected word line $WL_1$ are driven so that the threshold voltage is decreased, the time required until the pulse is applied from the decoder dec to the word line $WL_1$ can be shortened. Further, since the well in the non-selected circuit block CT2(2) is not driven, an increase in the power and the subthreshold current accompanying the pulse driving never occurs. A well block selector selects the driving of the well in one of the circuit blocks according to the internal address signal.

Figure 11:
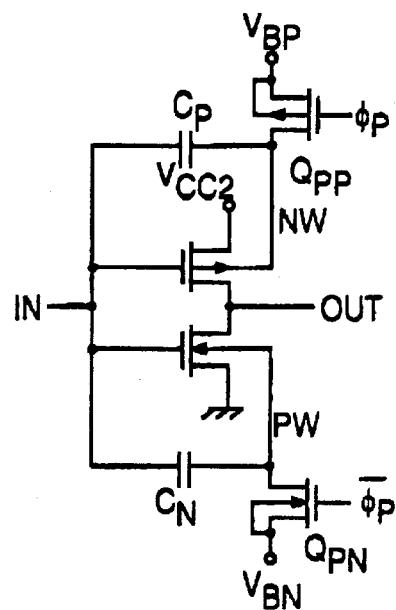
FIG. 11 illustrates a CMOS inverter constructed according to the teachings of the present invention.

FIG. 11 shows an embodiment of the present invention in the form of one inverter for use as the circuit block CT2 of FIG. 5, wherein the control signals $\phi$ and $/\phi$ are generated from an input signal In. When the level of the input signal In is changed from L to H, the voltages of the substrates (NW, PW) are increased because of the coupling by the respective capacitors $C_P$, $C_N$. Therefore, the subthreshold current becomes small as the threshold voltage of the NMOSFET increases. Moreover, the load driving ability of the inverter increases as the threshold voltage of the NMOSFET decreases.

When the level of the input signal In is changed from H to L, the substrate voltages are conversely decreased. Therefore, the threshold voltage of the PMOSFET is lowered and the load driving ability increases. Moreover, the threshold voltage of the NMOSFET increases, whereby the subthreshold current is decreased. Thus, the threshold voltages of the MOSFETs are automatically varied by the input signal, and the load driving capability of the inverter can be increased while the subthreshold current is suppressed.

The control signals $\phi_p$ and $/\phi_p$ are used when the power supply is turned on or for refreshing the substrate (well), as shown in FIG. 5.

Figure 12:
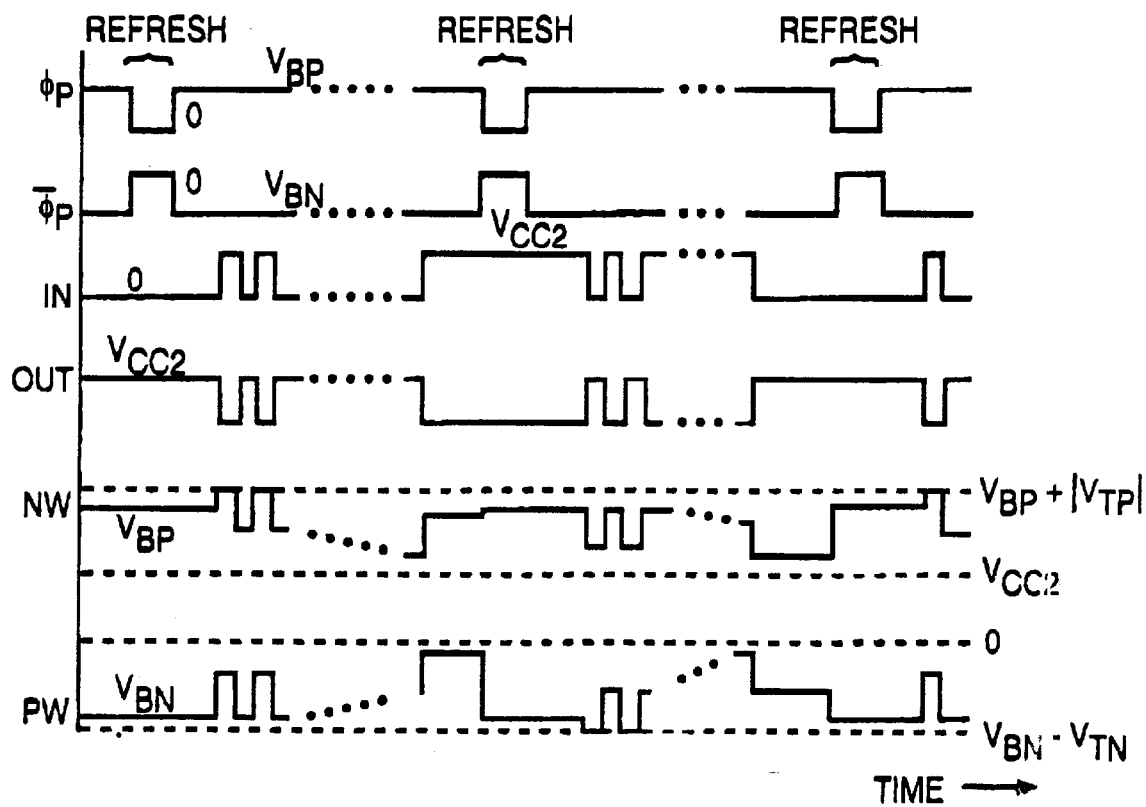
FIG. 12 is a chart of timing diagrams for the CMOS inverter illustrated in FIG. 11.

FIG. 12 shows a detailed timing chart in connection with the operations described above. $V_{TP}$ and $V_{TN}$ are the threshold voltages of the respective PMOSFET and NMOSFET, and these are separately expressed herein. The highest and lowest voltages of the wells (NW, PW) are clamped to $V_{BP}+V_{TP}$, $V_{BN}-V_{TN}$ since the transistors $Q_{PP}$, $Q_{PN}$ serve as diodes.

Figure 13:
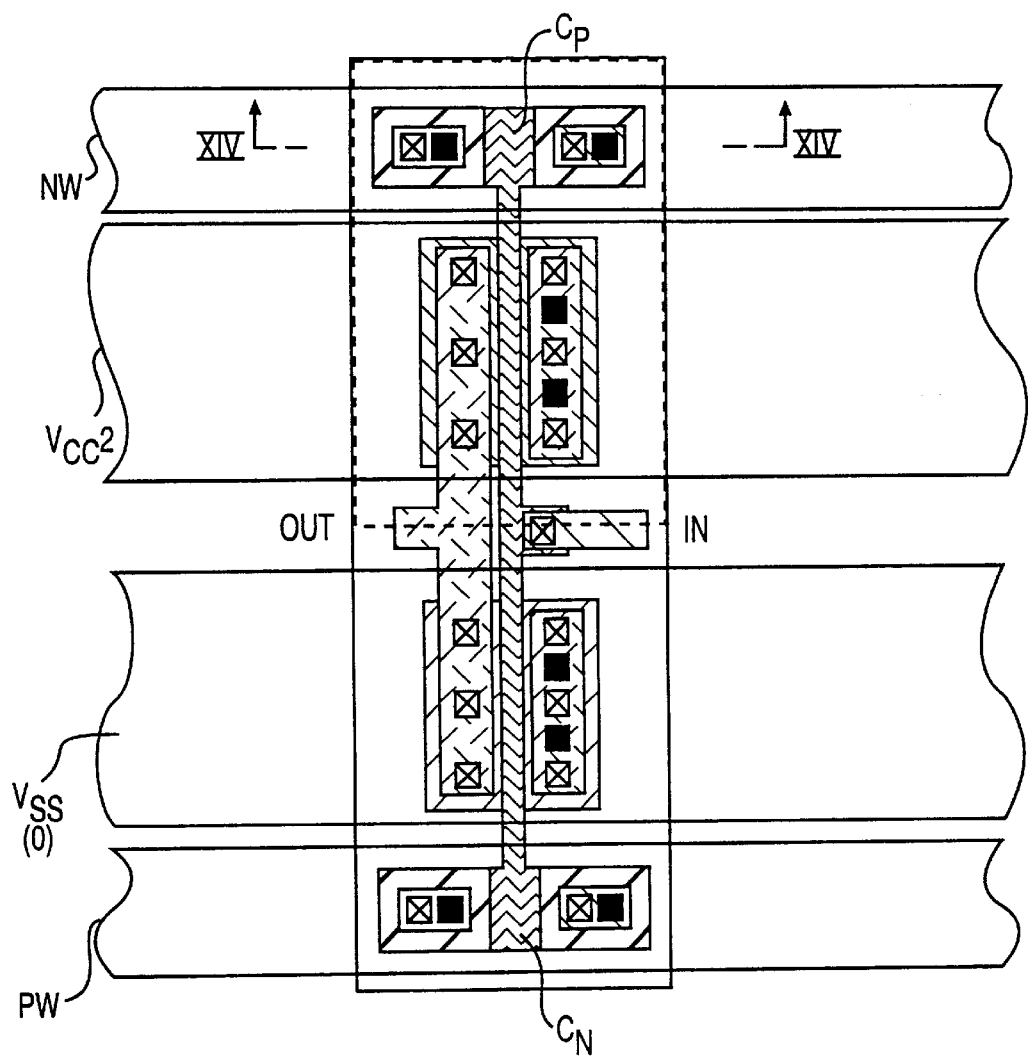
FIG. 13 is a layout for the circuit of FIG. 11.
Figure 13:
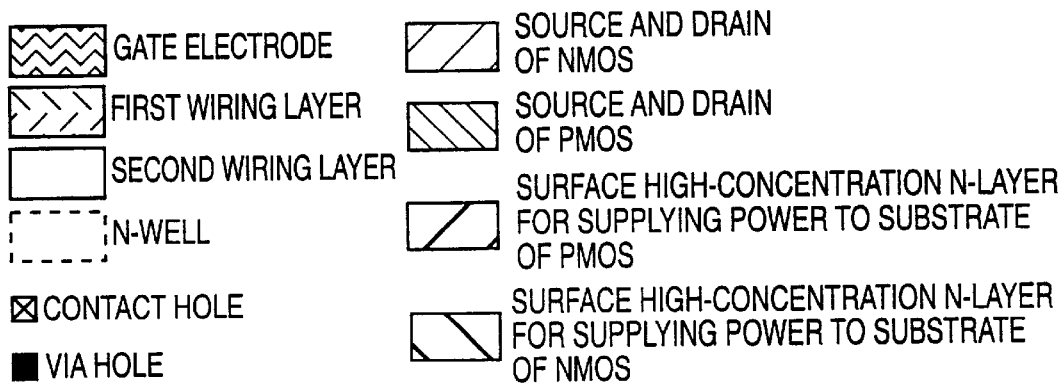
Figure 14:
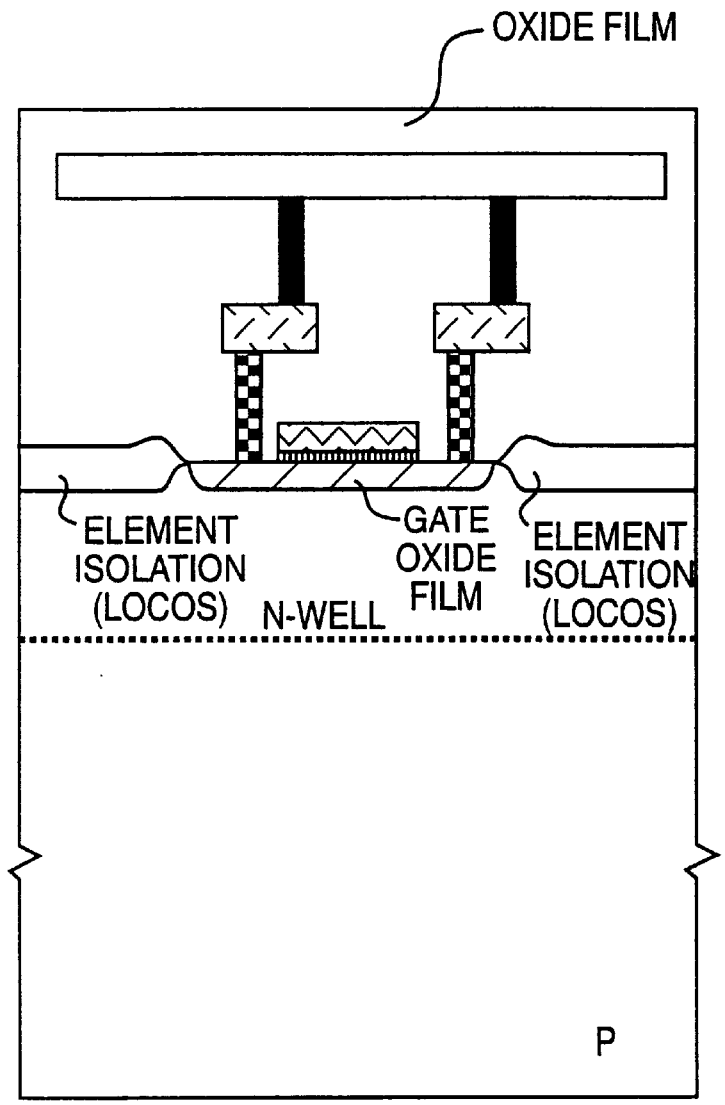
FIG. 14 is a sectional view taken along XIV—XIV of the layout shown in FIG. 13.
Figure 14:
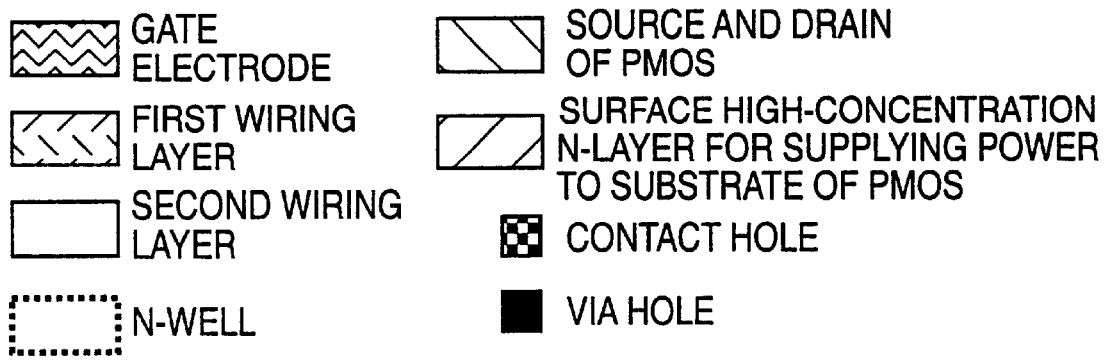

FIG. 13 shows an example of a layout of the circuit of FIG. 11. FIG. 14 is a sectional view taken along lines XIV—XIV of the layout of FIG. 11. The transistors $Q_{PP}$, $Q_{PN}$ are formed separately from the wells, and the capacitors $C_P$, $C_N$ are materialized by extending each of the gate electrodes up to a high-concentration surface layer, which supplies power to the substrate.

Figure 15:
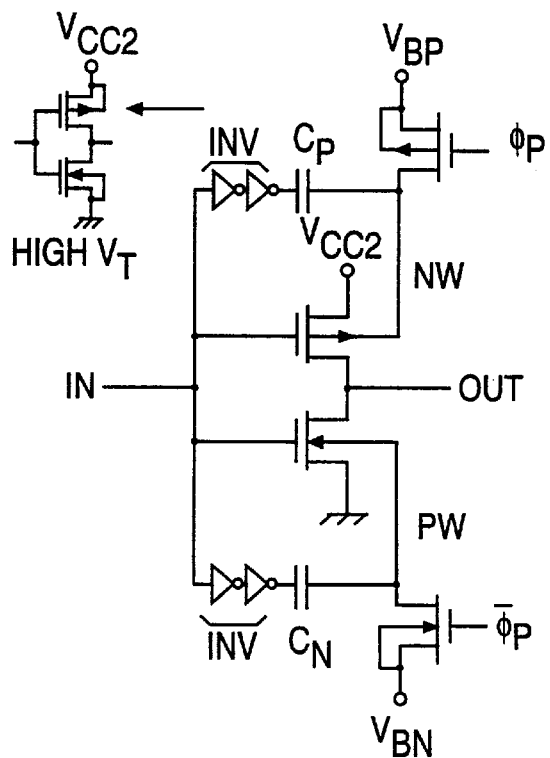
FIG. 15 shows a modification of the circuit diagram shown in FIG. 11.

FIG. 15 shows another circuit embodiment of the present invention, which provides the same function as that of the circuit of FIG. 11. The capacitors $C_P$, $C_N$ are connected via an inverter series INV. The inverter series INV may be constituted by high-$V_T$ MOSFETs or by low-$V_T$ MOSFETs, though the ratio of gate width W to gate length L is small. Although the input capacitance of the inverter of FIG. 11 is increased by the capacitors $C_P$, $C_N$, the increase in the input capacitance can be suppressed, since the inverter becomes a buffer in this embodiment of the invention.

Figure 16:
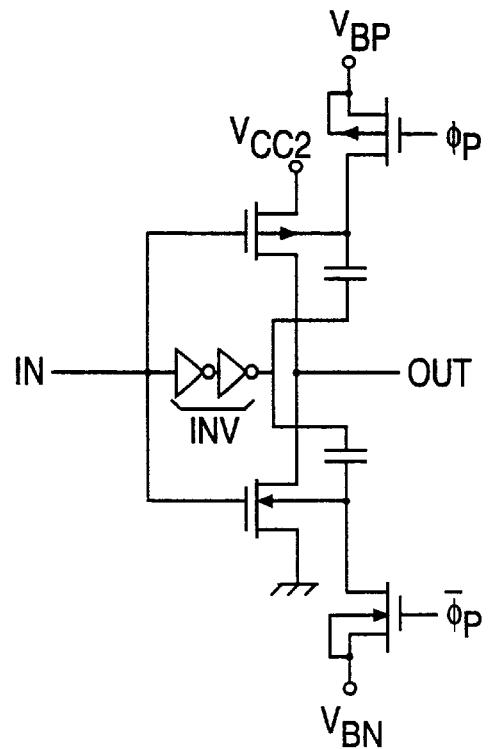
FIG. 16 shows another modification of the circuit of FIG. 11.

FIG. 16 shows an embodiment in which two inverter series INV are combined, wherein the input capacitance and the area are further reduced.

Figure 17:
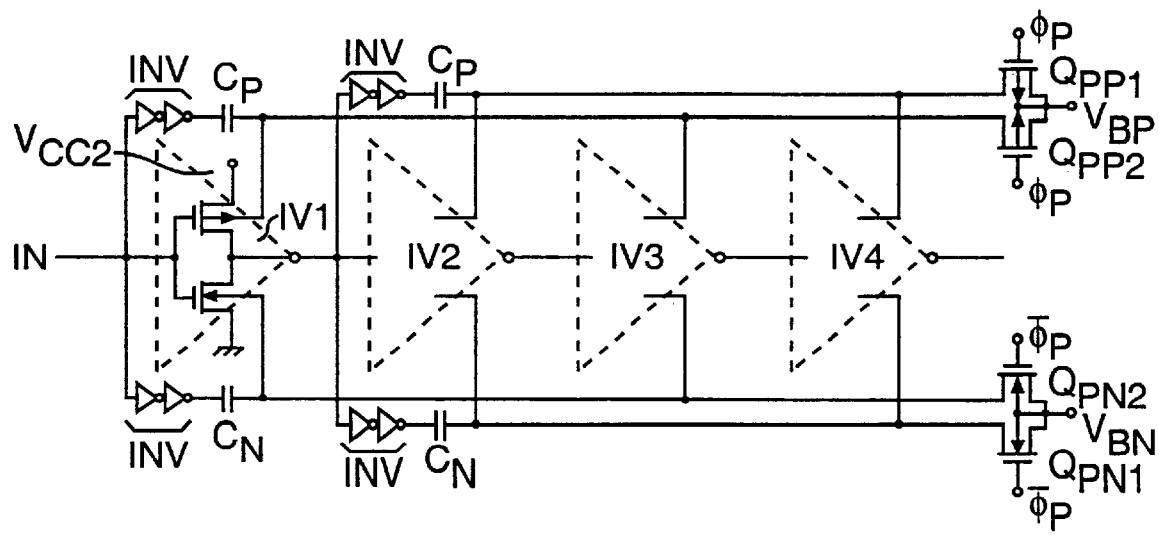
FIG. 17 illustrates an example of an application of the present invention to an inverter series.

FIG. 17 shows an application of plural inverter series like that illustrated in FIG. 15. In FIG. 17, a circuit is shown in which inverters IV1, IV2, IV3, IV4 are connected in series. A smaller area is effectively accomplished as the transistors $Q_{PP}$, $Q_{PN}$ and the capacitors $C_P$, $C_N$ are commonly used by the plurality of inverter series. In other words, though the substrate requires two kinds of well wiring, with every well connected by a wire, in order to decrease the threshold voltages of the MOSFETs caused to conduct and increase the threshold voltages of those caused not to conduct, the inverters IV2 and IV4 commonly use transistors $Q_{PP1}$, $Q_{PN1}$, a combination of INV+capacitor $C_P$, and a combination of INV+capacitor $C_N$, whereas the inverters IV1 and IV3 commonly use transistors $Q_{PP2}$, $Q_{PN2}$, another combination of INV+capacitor $C_P$, and another combination of INV+capacitor $C_N$. The common usage like this is applicable to any of the embodiments shown in FIGS. 11 and 16.

Figure 18A:
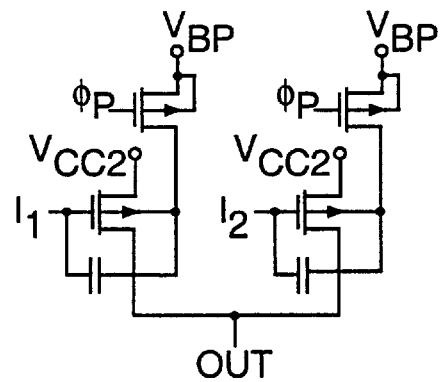
FIG. 18(a) shows a PMOS NOR logic circuit constructed according to the teachings of the present invention.
Figure 18B:
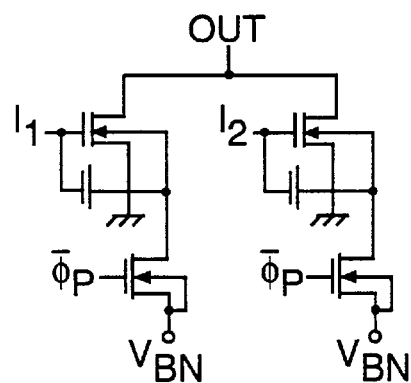
FIG. 18(b) shows an NMOS NOR logic circuit constructed according to the teachings of the present invention.

FIGS. 18(a)–18(b) show examples of applying the circuit of FIG. 11 to NOR logic circuits. In the PMOS circuit of FIG. 18(a), an output Out changes from L to H when the level of at least one of the inputs ($I_1$, $I_2$) becomes L. In the NMOS circuit of FIG. 18(b), the output Out changes from H to L when the level of at least one of the inputs ($I_1$, $I_2$) becomes H.

Figure 19A:
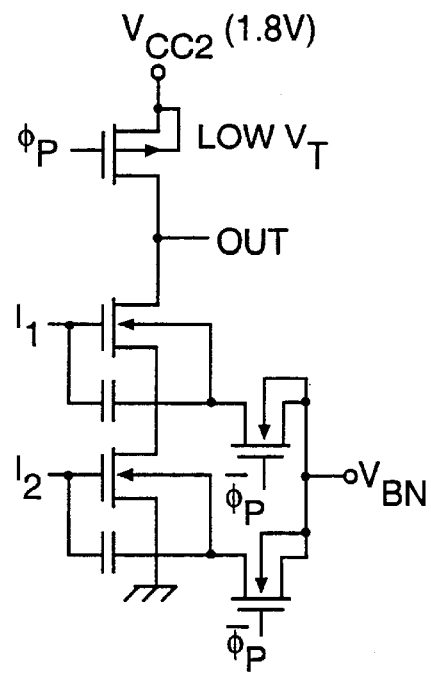
FIG. 19(a) shows an NMOS NAND logic circuit constructed according to the teachings of the present invention.
Figure 19B:
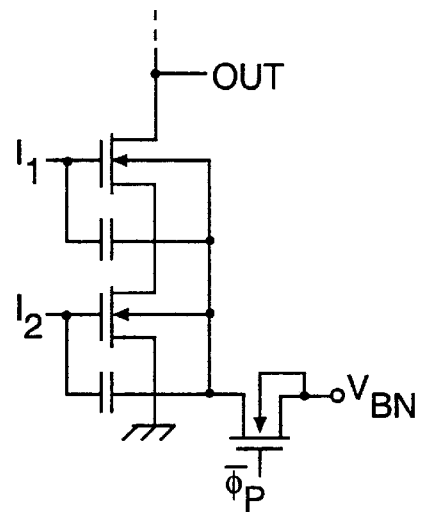
FIG. 19(b) shows another NMOS NAND logic circuit, in which precharged MOSFETs share a common well.
Figure 19C:
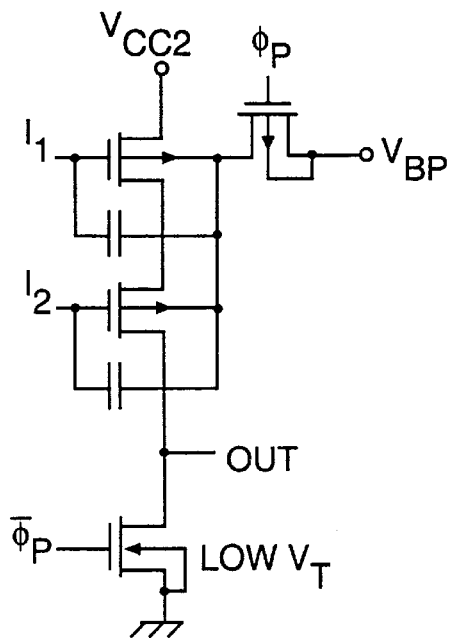
FIG. 19(c) shows a PMOS NAND logic circuit constructed according to the teachings of the present invention.

FIGS. 19(a)–19(c) show examples of applying the circuit of FIG. 11 to NAND logic circuits. The output Out is initially precharged at 1.8 V with the precharged signal $\phi_P$ and the PMOSFETs at low threshold voltages, and the inputs ($I_1$, $I_2$) are all L (0 V). When all inputs become H (1.8 V), then, the series-connected NMOSFETs are caused to conduct and the output is discharged to 0 V. This circuit is applicable to the line decoder of FIG. 10.

Further, FIG. 19(b) shows a case where the area is decreased by providing the precharged MOSFETs with a common well. Even when the capacitance of the well becomes doubled in comparison with that of FIG. 19(a), the well is driven by the input $I_1$ and the two capacitors connected to the input $I_2$. Therefore, the output Out can be discharged quickly as the variation of the well potential is equalized to that of FIG. 19(a).

The NAND circuit of FIG. 19(c) is constituted by PMOSFETs. When the inputs $I_1$, $I_2$ simultaneously become L, the output Out that has been precharged to 0 V is changed to H.

A description will subsequently be given of an application of the present teachings to the interface circuit I/O of FIG. 3.

Figure 20A:
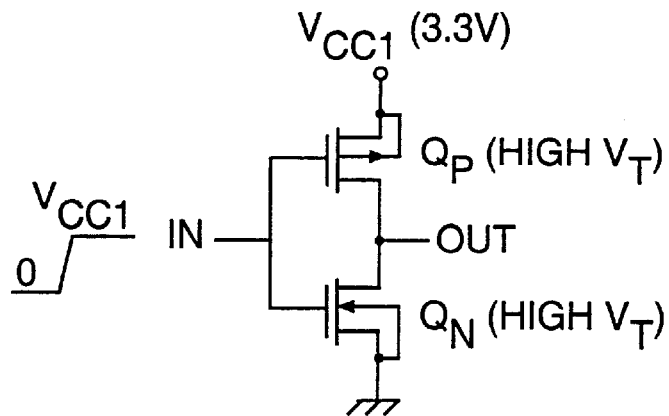
FIG. 20(a) shows an input buffer employing only high-threshold-voltage MOSFETs.
Figure 20B:
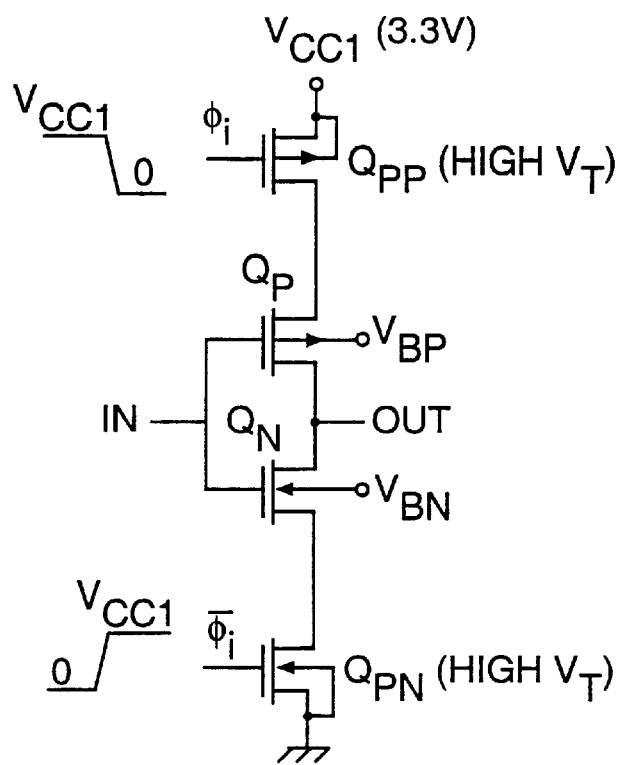
FIG. 20(b) shows an input buffer employing low-threshold-voltage MOSFETs with high-threshold-voltage MOSFETs serving as switches.

FIGS. 20(a) and 20(b) show input buffers (In) from the outside of the chip. In FIG. 20(a), there is shown a well-known circuit using MOSFETs operating at a voltage of 3.3 V and having a high threshold voltage $V_T$. In FIG. 20(b), there are shown MOSFETs of low threshold voltage $V_T$ used for transistors $Q_P$, $Q_N$. The transistors $Q_{PP}$, $Q_{PN}$ serve as switches, and have a high threshold voltage. The transistors $Q_{PP}$, $Q_{PN}$ are held off when the input buffer is not needed, and the subthreshold current of the transistors $Q_P$, $Q_N$ is prevented from flowing between the supply voltage $V_{CC1}$ and ground. The transistors $Q_{PP}$, $Q_{PN}$ are turned on when an effective signal is input.

Figure 21A:
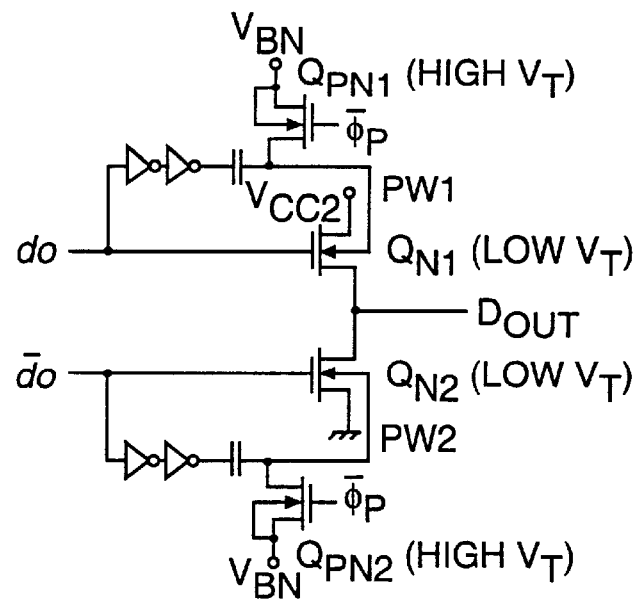
FIG. 21(a) shows a data output circuit constructed according to the teachings of the present invention.
Figure 21B:
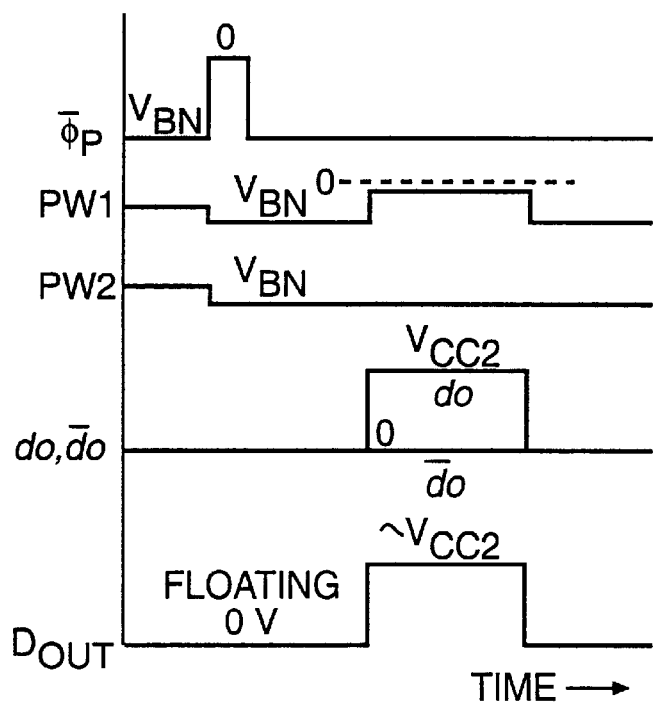
FIG. 21(b) shows timing diagrams for the circuit of FIG. 21(a)

FIGS. 21(a) and 21(b) show a case where the circuit of FIG. 11 is applied to the data output stage of the interface circuit I/O. As is often used in a dynamic memory (DRAM) chip for general use, the data output stage in the interface circuit I/O is constituted by, for example, NMOSFETs of the same polarity, and driven by a low supply voltage $V_{CC2}$ in this example. The output (Dout) portion is in the form of a wired-OR circuit in which a plurality of similar output buffer circuits are connected in common.

In the case of the wired-OR connection, when any one of the selected output circuits is feeding data to the commonly connected output portion Dout, the other output buffer circuits are completely off. When all the output buffer circuits are de-selected, the common output (Dout) portion is completely off. In order to accomplish this operation in the low-operating voltage, low-threshold voltage operation, the above-described invention is effective.

In FIG. 21(a), transistors $Q_{N1}$, $Q_{N2}$ are low-$V_T$ NMOSFETs at the output stage, and transistors $Q_{PN1}$, $Q_{PN2}$ for use in applying the substrate (well) voltage thereto are PMOSFETs of high threshold voltage. This circuit is characterized in that the threshold voltage of the output stage MOSFETs ($Q_{N1}$, $Q_{N2}$) is varied according to information on a pair of data output signals do, /do. First, substrates PW1, PW2 are precharged to the potential of the substrate bias voltage $V_{BN}$ by turning on the transistors $Q_{PN1}$, $Q_{PN2}$. The subthreshold current made to flow between the transistors $Q_{N1}$, $Q_{N2}$, $Q_N$ is set to a value that can be ignored. Then data is fed to the output Dout when the output signals do, /do become the combination of H and L or L and H according to the information. The threshold voltage of the conducting NMOSFET then becomes lowered because of the coupling by the capacitor, and the load driving capability is improved, ensuring a high-speed operation. Since the threshold voltage of the other NMOSFET (which is not driven) remains at the high level, the subthreshold current can be ignored.

Figure 22A:
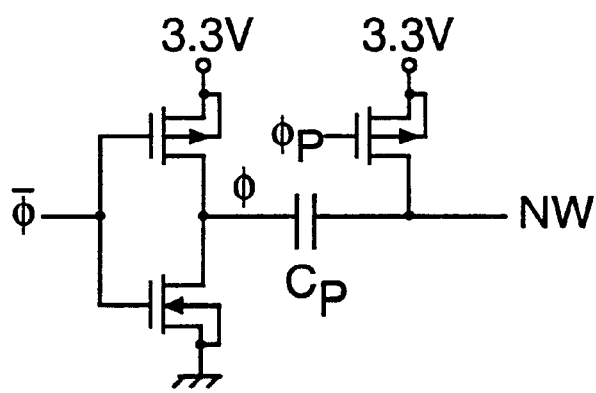
FIGS. 22(a) and 22(b) show well driving circuits constructed according to the teachings of the present invention.
Figure 22B:
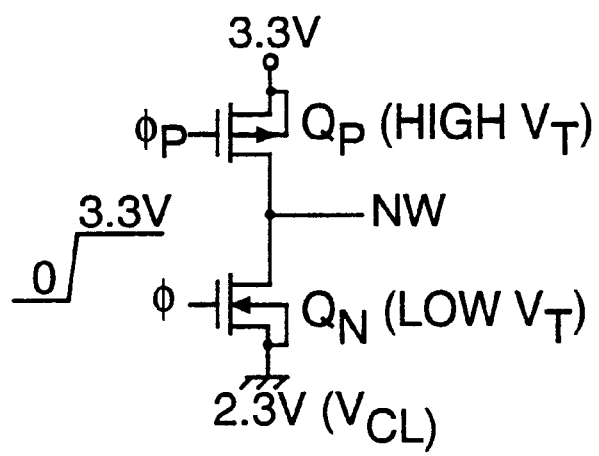

FIGS. 22(*a*) and 22(*b*) show specific examples of well (NW) driving circuits. FIG. 22(*a*) shows an example in which a CMOS inverter generates the control signal φ of FIG. 5. By adjusting the ratio of the parasitic capacitance of the well to that of the capacitor $C_P$, the voltage (2.3 V) of the well W of FIG. 6, for example, can be generated. FIG. 22(*b*) shows a circuit for applying a supply voltage of 2.3 V directly to the well NW without using the capacitor $C_P$. The control signal φ ranges from 0 V to 3.3 V, and the source voltage of the transistor $Q_N$ is 2.3 V. Therefore, the transistor $Q_N$ can be cut off satisfactorily when the control signal φ is 0 V and the transistor $Q_N$ has a low threshold voltage. When the level of the control signal φ becomes 3.3 V, the well NW can be driven at high speed because of the low threshold voltage. In this case, the 2.3 V source voltage can be produced by stepping down the external voltage 3.3 V within the chip.

Figure 23:
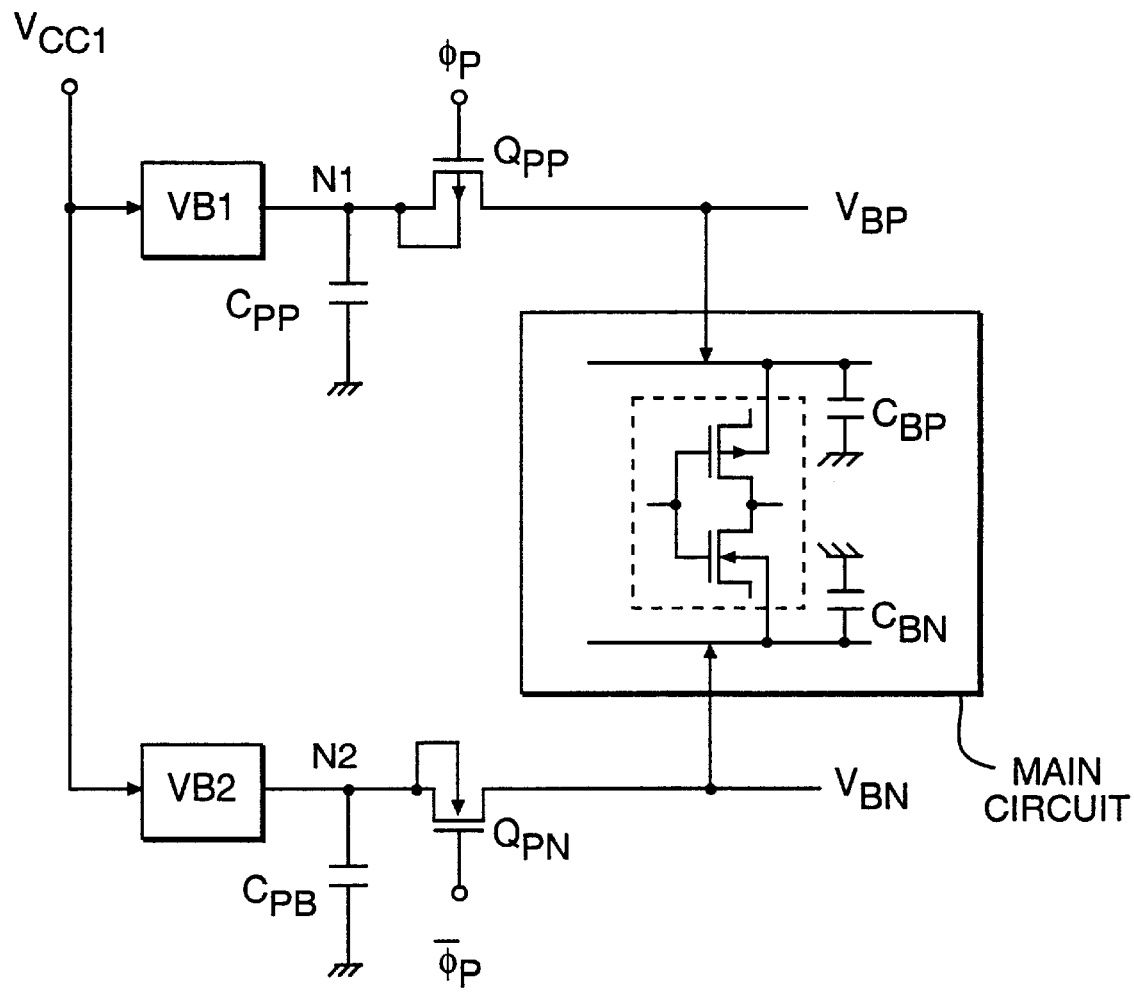
FIG. 23 shows a technique for applying a well voltage according to the present invention.

FIG. 23 shows still another embodiment of the present invention. VB1, VB2 represent circuits (as will be described later) for generating the substrate (well) voltage from the supply voltage $V_{CC1}$ within the chip. High-$V_T$ MOSFETs $Q_{PP}$, $Q_{PN}$ serve as switches that are turned on when the substrate voltage thus generated is applied to the substrate of the MOSFETs in the main circuit (for example, at the time of standby or the like as described above).

Further, capacitors $C_{BP}$, $C_{BN}$ are substrate capacitors of the MOSFETs in the main circuit. As capacitors $C_{PP}$, $C_{PB}$ are arranged to have values sufficiently greater than those of the capacitors $C_{BP}$, $C_{BN}$, the fluctuation of the substrate voltage is minimized even when the above switches are turned on. Together with other circuits, these capacitors may be mounted on the same chip or realized as tantalum capacitors and electrolytic capacitors outside the chip.

When these capacitors are formed outside the chip, nodes N1, N2 in FIG. 23 serve as packaging terminals and, because the capacitors are externally fitted thereto, the number of terminals increases. However, a large capacitance becomes readily obtainable. Consequently, the substrate voltage required in the standby state can be set quickly since it is only necessary to transfer part of the large amount of charge prestored in the capacitors $C_{PP}$, $C_{PB}$ to the capacitors $C_{BP}$, $C_{BN}$.

Since the capacitance of the power supply of the substrate-voltage generating circuits VB1, VB2 is generally small, no problem arises from charging the capacitors $C_{BP}$, $C_{BN}$ therethrough. The required substrate voltage may also be applied directly to the nodes N1, N2 from the outside via the packaging terminals without using the substrate-voltage generating circuits VB1, VB2.

Figure 24:
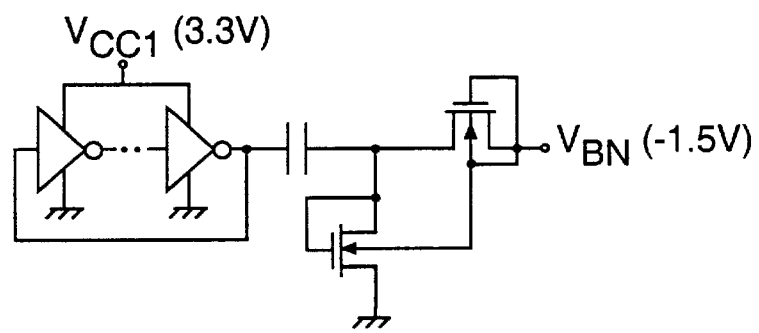
FIG. 24 shows a conventional negative voltage power supply circuit.
Figure 25:
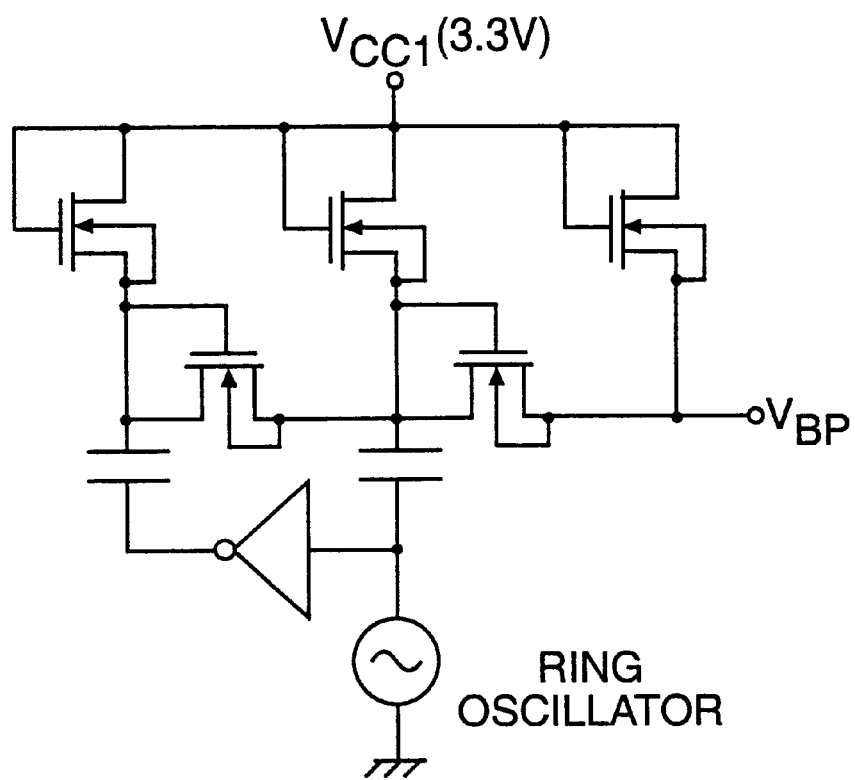
FIG. 25 shows a conventional booster power supply circuit.
Figure 26:
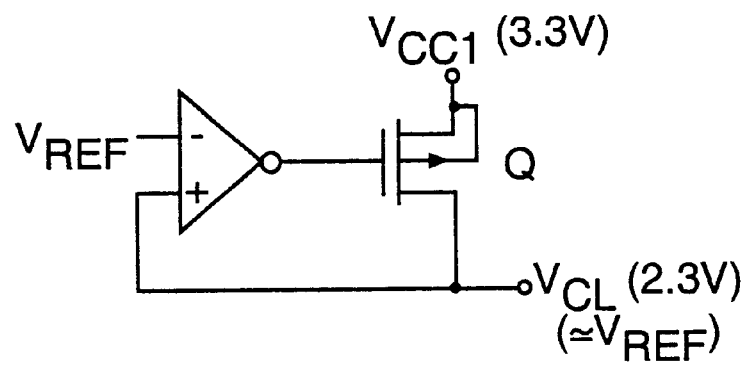
FIG. 26 shows a conventional step-down voltage power supply circuit.

FIGS. 24–26 are conceptual diagrams of power supplies for generating the substrate bias voltage $V_{BN}$, the substrate bias voltage $V_{BP}$ and the step-down voltage $V_{CL}$, use of which has been set forth above. A detailed description of this circuit has been given in "Cho-eluesuai" (written by Sumio Itoh, published by Baifukan on Nov. 5, 1994, pp 239–328).

FIG. 24 shows a circuit for producing a negative supply voltage (e.g., −1.5 V) based on a power supply of 3.3 V, using a ring oscillator and a diode-connected MOSFET.

FIG. 25 shows a circuit for producing a booster supply voltage of 3.3 V or higher using the ring oscillator on the chip. Although a description has been given on the assumption of $V_{BP}$=3.3 V, the booster power supply is unnecessary in this case. As the value of the substrate bias voltage $V_{BP}$ is determined by the characteristics of the MOSFETs, however, a booster power supply with $V_{CC1}$ (3.3 V) or higher is generally required.

FIG. 26 shows a circuit for obtaining the step-down voltage $V_{CL}$ (2.3 V) by the use of the 3.3 V power supply. The value of the step-down voltage $V_{CL}$ may be determined by a reference voltage $V_{REF}$ generated on the chip, and a comparator.

Figure 27:
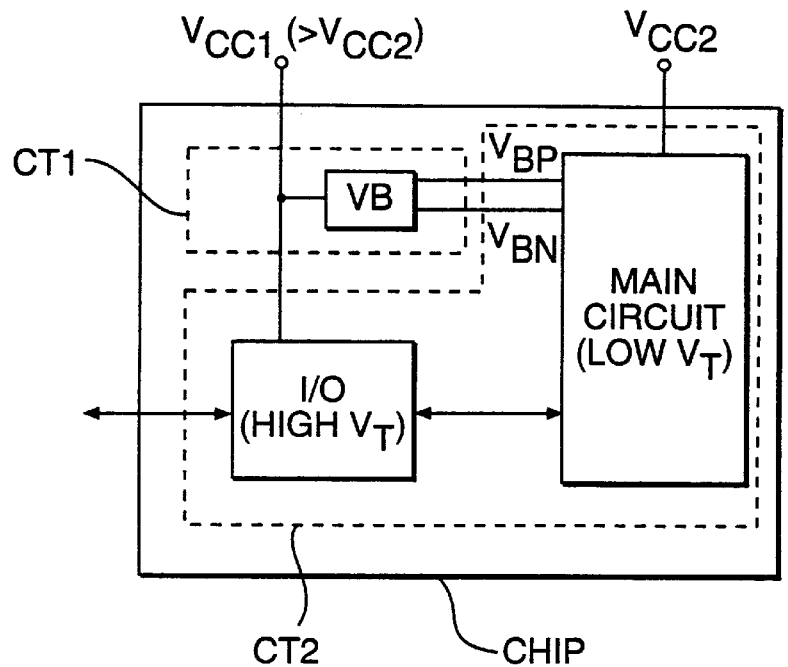
FIG. 27 shows an arrangement of a dual-power-supply chip constructed according to the teachings of the present invention.

Although descriptions have been given primarily of examples of applications for the internal circuit of FIG. 3, the present invention is not limited to these exemplary applications. FIG. 27 is an illustration resulting from simplifying the embodiment of the present invention shown in FIG. 3, which will be used to describe still another embodiment thereof.

In FIG. 27, the interface circuit I/O is constituted mainly by MOSFETs having high threshold voltages, and is supplied with a high supply voltage $V_{CC1}$. The high supply voltage $V_{CC1}$ (>$V_{CC2}$) is also applied to the substrate-voltage generating circuit VB so as to generate substrate bias voltages $V_{BP}V_{BN}$. The main circuit is constituted by MOSFETs of low threshold voltage, and is supplied with a low supply voltage ($V_{CC2}$)

As described above, the interface circuit I/O need not be constituted by high-$V_T$ MOSFETs, and the main circuit also need not always be constituted by low-$V_T$ MOSFETs. Moreover, instead of supplying the substrate bias voltage $V_{BP}$ to the main circuit as shown, the supply voltage $V_{CC1}$ may be directly supplied to the main circuit as the substrate bias voltage VBP if the threshold voltage $V_T$ of the PMOSFETs in the main circuit is sufficiently high.

Figure 28:
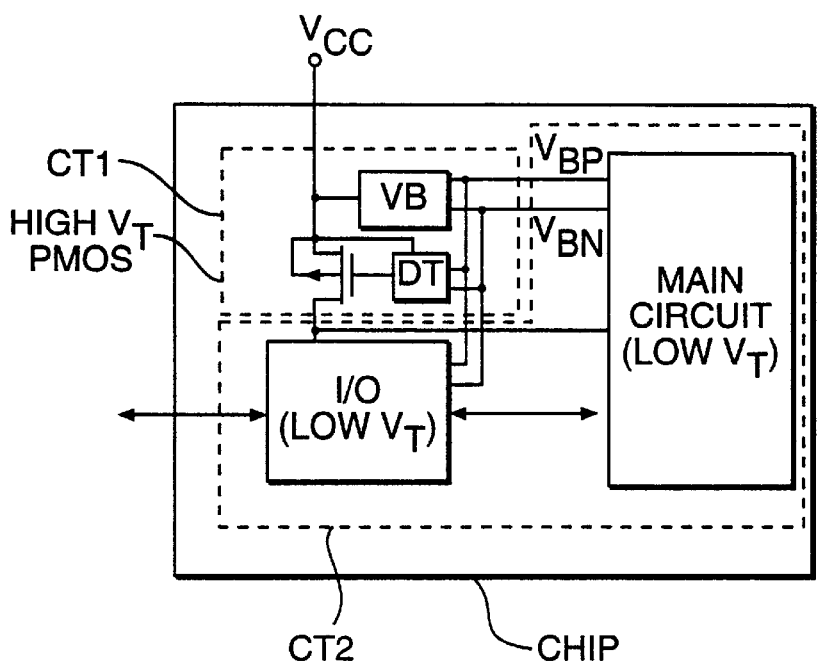
FIG. 28 shows a single-power-supply chip constructed according to the teachings of the present invention.

FIG. 28 shows an example of the present invention arranged on a single chip and employing a single power supply, with additional reference to FIG. 2. A substrate bias monitor circuit DT is used for detecting the substrate potential, to ensure a sufficiently stable power supply when the power supply is turned on. The detected output turns on the high-$V_T$ PMOSFET, whereby the interface circuit I/O and the main circuit are supplied with the supply voltage $V_{CC}$.

Figure 29:
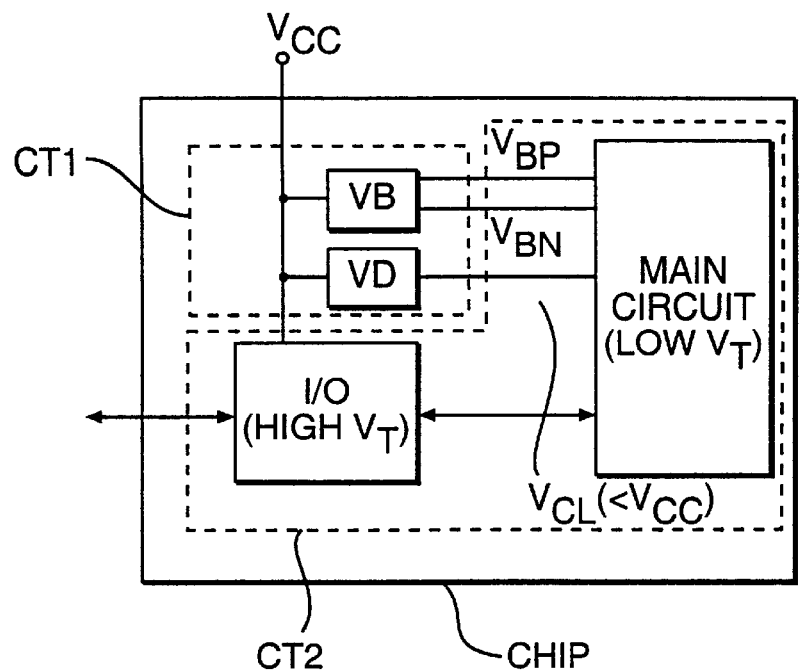
FIG. 29 shows another single-power-supply chip constructed according to the teachings of the present invention.

FIG. 29 shows an embodiment in which a step-down voltage power supply circuit VD is employed. The step-down voltage power supply circuit VD produces a low supply voltage $V_{CL}$ from the high supply voltage $V_{CC}$, and supplies the voltage to the main circuit. With the single power supply $V_{CC}$, the step-down voltage $V_{CL}$ (applied after the substrate bias voltages $V_{BP}V_{BN}$ are applied) and the substrate bias voltages $V_{BP}V_{BN}$ are made internally adjustable so that an optimum operating voltage may be attained for the devices constituting the main circuit.

Figure 30:
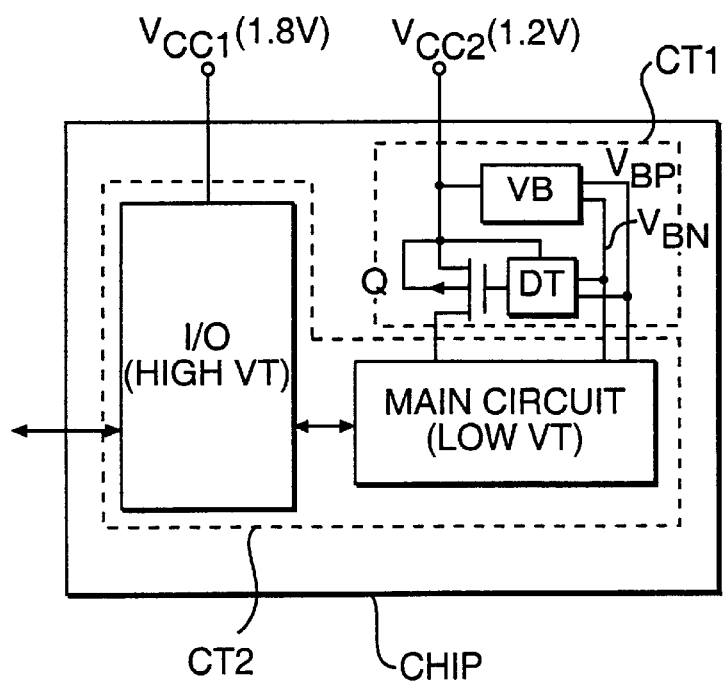
FIG. 30 shows another arrangement of a dual-power-supply chip constructed according to the teachings of the present invention.

FIG. 30 shows an exemplary system that gives the user no restriction on the order in which the power supply is turned on, even in the case where two kinds ($V_{CC1}$, $V_{CC2}$) of external power supply are employed.

The main circuit, which uses low-$V_T$ MOSFETs, very often is operated with the low voltage power supply ($V_{CC2}$) by applying the present invention shown in FIG. 28. On the other hand, the interface circuit I/O, which uses MOSFETs of high threshold voltage $V_T$, is operated with the other supply voltage (e.g., $V_{CC1}$). As there exists a difference in operating voltage between the interface circuit I/O and the main circuit, a small-scale voltage-level conversion circuit is required. However, the circuit block operating with the supply voltage $V_{CC1}$ and the circuit block operating with the supply voltage $V_{CC2}$ operate substantially independently, thus preventing the main circuit from being latched up.

Figure 31:
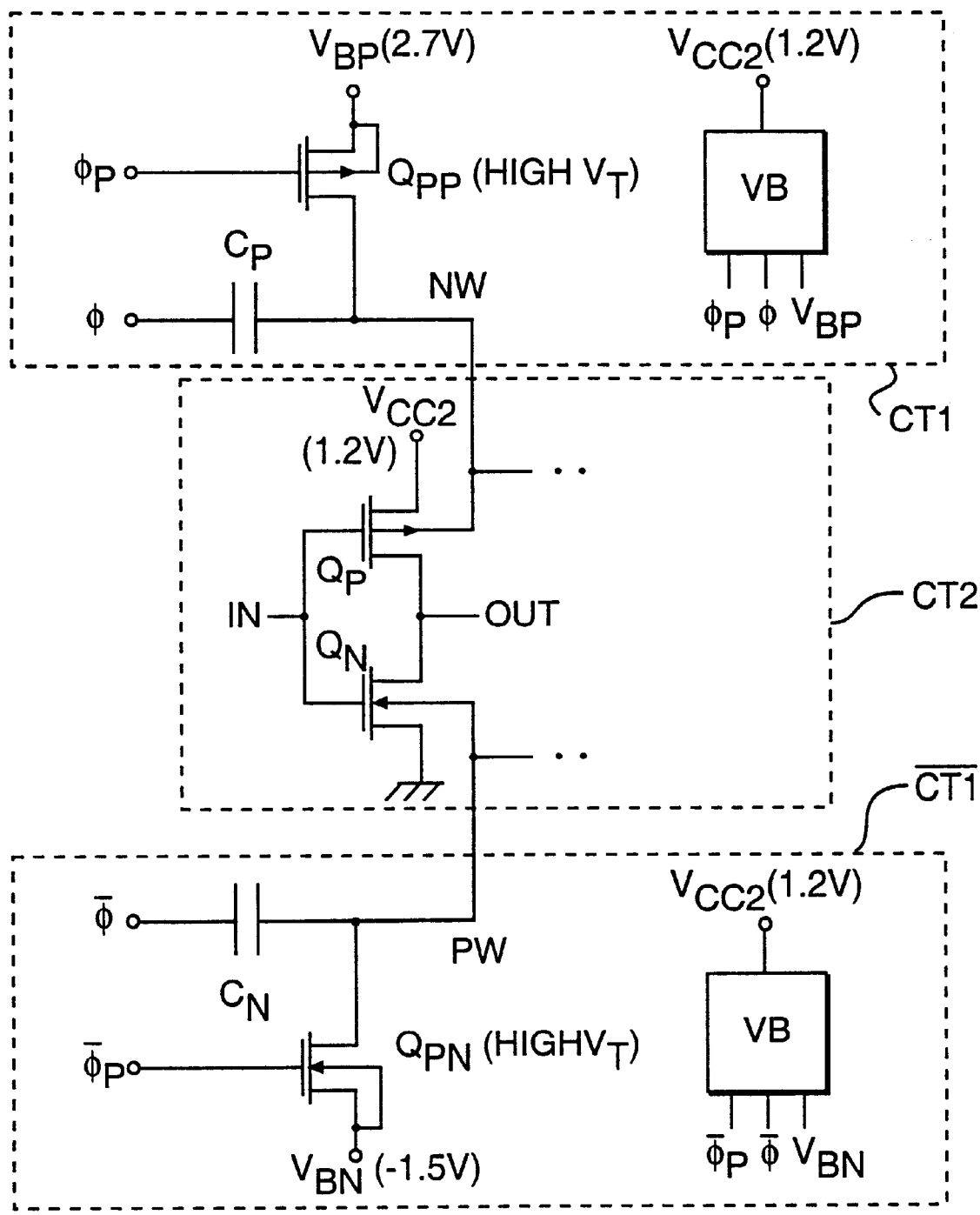
FIG. 31 shows the internal circuit of a dual-power-supply chip constructed according to the teachings of the present invention.

FIG. 31 shows the internal circuitry for the embodiment shown in FIG. 30, and corresponds to the internal circuitry shown in FIG. 5. In this example, it is assumed that the interface circuit I/O operates with a high voltage power supply of 1.8 V and the main circuit with a low voltage power supply of 1.2 V. A booster ($V_{BP}$=2.7 V) power supply is formed in a booster circuit operating with the supply voltage $V_{CC2}$, and the control signal $\phi_P$ has a pulse width ranging from 0 V up to the substrate bias voltage $V_{BP}$. Further, the control signals $\phi$, /$\phi$ have a pulse width ranging from, for example, 0 V up to the substrate bias voltage $V_{BP}$·$V_{BN}$ (−1.5 V) is produced by the negative voltage supply voltage circuit, and the control signal /$\phi_P$ has a pulse width ranging from 0 V up to the substrate bias voltage $V_{BP}$. Therefore, the transistors $Q_{PP}$, $Q_{PN}$ are turned on when the supply voltage $V_{CC2}$ is applied and a sufficient well voltage is supplied to the low-$V_T$ transistors $Q_P$, $Q_N$, whereby the transistor Q of FIG. 30 is turned on and the supply voltage $V_{CC2}$ is applied to the main circuit of low threshold voltage $V_T$ of FIG. 31 (as the application is effected later than the application of $V_{CC2}$, it is distinguished from $V_{CC2}$).

In the above-described embodiments of the present invention, the substrate structure as well as the structure of transistors is not especially restricted. For example, MOS-FETs of the SOI (Silicon (Semiconductor) on Insulator) structure may be used, so long as their threshold voltages $V_T$ are controllable by the substrate voltage. The high reliability of the chip as a whole is assured by making the thickness of the gate oxide film of the MOSFETs to which a high supply voltage (e.g., Vcc1) is applied, greater than the thickness of the gate oxide film of the MOSFETs to which a low supply voltage (e.g., Vcc2) is applied.

Although there has been shown an example of integrating all sorts of functional blocks in FIG. 3, the present invention is applicable to independent chips including, for example, a dynamic memory (DRAM) chip, a static memory (SRAM) and a microprocessor chip.

Various modifications of the present invention will become apparent to those of ordinary skill in the art. All such modifications that basically rely upon the teachings through which the invention has advanced the state of the art are properly considered within the spirit and scope of the invention.

I claim:

1. A semiconductor device comprising:
   an interface circuit, which interfaces with an exterior of said semiconductor device, arranged to receive a first supply voltage and including a first transistor having a first threshold voltage;
   a logic circuit arranged to receive a second supply voltage which is lower than said first supply voltage, and including a second transistor having a second threshold voltage lower than said first threshold voltage, said second threshold voltage being effected by a substrate voltage of the logic circuit, wherein the substrate voltage of the logic circuit is derived from the first supply voltage; and
   a first memory array including static memory cells each including a third transistor having a third threshold voltage higher than said second threshold voltage, and arranged to receive a third supply voltage corresponding to said third threshold voltage and to the operation speed of the third transistor, said third threshold voltage being effected by a substrate voltage of the first memory array, wherein the substrate voltage of the first memory array is derived from the first supply voltage;
   wherein said third supply voltage is higher than said second supply voltage.

2. A semiconductor device according to claim 1, wherein said first supply voltage is used as said third supply voltage.

3. A semiconductor device according to claim 1, wherein a leakage current flows through a source-drain path of said second transistor even if a voltage difference does not exist between a gate and a source of said second transistor.

4. A semiconductor device according to claim 1, further comprising:
   a second memory array including dynamic memory cells each having a fourth transistor and a capacitor,
   wherein a threshold voltage of said fourth transistor is higher than said second threshold voltage.

5. A semiconductor device according to claim 1, wherein a first well potential with a substantially DC current is applied to said third transistor.

6. A semiconductor device according to claim 5, wherein a second well potential is applied to said second transistor by capacitive coupling.

7. A semiconductor device comprising:
   an interface circuit, which interfaces with an exterior of said semiconductor device, arranged to receive a first supply voltage and including a first transistor having a first threshold voltage;
   a logic circuit arranged to receive a second supply voltage which is lower than said first supply voltage, and including a second transistor having a second threshold voltage lower than said first threshold voltage;
   a memory array including memory cells, each having a flip-flop circuit, which includes a third transistor having a third threshold voltage, and which is arranged to receive a third supply voltage corresponding to said third threshold voltage higher than said second threshold voltage and to the operation speed of said third transistor;
   a first substrate-voltage generating circuit which generates a first well potential for said third transistor included in said memory array; and
   a second substrate-voltage generating circuit which generates a second well potential for said second transistor included in said logic circuit;
   wherein said first supply voltage is applied to both said first and second substrate-voltage generating circuits, and said third supply voltage is higher than said second supply voltage.

8. A semiconductor device according to claim 7, wherein a leakage current flows through a source-drain path of said second transistor even if a voltage difference does not exist between a gate and a source of said second transistor, and
   wherein said first threshold voltage and said third threshold voltage are higher than said second threshold voltage.

9. A semiconductor device according to claim 8,
   wherein said first substrate-voltage generating circuit generates said first well potential with a substantially DC current, and
   wherein said second substrate-voltage generating circuit generates said second well potential by capacitive coupling.

* * * * *